(12) United States Patent
Francis et al.

(10) Patent No.: US 10,957,736 B2
(45) Date of Patent: Mar. 23, 2021

(54) LIGHT EMITTING DIODE (LED) COMPONENTS AND METHODS

(71) Applicant: Cree, Inc., Durham, NC (US)

(72) Inventors: Aaron J. Francis, Apex, NC (US); Jasper Sicat Cabalu, Apex, NC (US); Colin Kelly Blakely, Franklinton, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/918,839

(22) Filed: Mar. 12, 2018

(65) Prior Publication Data
US 2019/0280043 A1    Sep. 12, 2019

(51) Int. Cl.
| | |
|---|---|
| *H01L 27/15* | (2006.01) |
| *H01L 33/62* | (2010.01) |
| *H01L 33/08* | (2010.01) |
| *H01L 33/54* | (2010.01) |

(52) U.S. Cl.
CPC ............ *H01L 27/156* (2013.01); *H01L 33/08* (2013.01); *H01L 33/54* (2013.01); *H01L 33/62* (2013.01)

(58) Field of Classification Search
CPC ..... H01L 27/156; H01L 33/62; H01L 33/483; H01L 33/486; H01L 33/54; H01L 27/3213; H01L 33/08
See application file for complete search history.

(56) References Cited

U.S. PATENT DOCUMENTS

| | | |
|---|---|---|
| 7,081,661 B2 | 7/2006 | Takehara et al. |
| 7,213,940 B1 | 5/2007 | Van De Ven et al. |
| D597,968 S | 8/2009 | Kobayakawa et al. |
| 7,791,061 B2 | 9/2010 | Edmond et al. |

(Continued)

FOREIGN PATENT DOCUMENTS

| | | |
|---|---|---|
| CN | 106 463 462 B | 11/2019 |
| EP | 1 806 782 A2 | 7/2007 |

(Continued)

OTHER PUBLICATIONS

Machine translation, Seong, Korean Pat. Pub. No. 2013-0087767A, translation date: Sep. 28, 2020, Espacenet, all pages. (Year: 2020).*

(Continued)

*Primary Examiner* — Victoria K. Hall
(74) *Attorney, Agent, or Firm* — Jenkins, Wilson, Taylor & Hunt, P.A.

(57) ABSTRACT

Light emitting diode (LED) components include a submount, at least one or more LED chip wirebonded on a first surface of the submount to electrical traces at the edges of the submount, and a molded encapsulant which is devoid of a curved lens or hemispherical lens and can have outer or lateral walls co-planar with exterior walls of the submount. An LED component can have a viewing angle that is greater than 125°. A method of providing an LED component includes providing a substantially flat submount, attaching one or more LED chip over a first surface of the submount, dispensing an encapsulant over the first surface of the submount over the LED chips, applying a press over the encapsulant to apply a heat and/or pressure to the encapsulant, and molding the encapsulant over the first surface of the submount.

21 Claims, 17 Drawing Sheets

(56) References Cited

U.S. PATENT DOCUMENTS

| | | |
|---|---|---|
| D632,659 S | 2/2011 | Hsieh |
| D634,282 S | 3/2011 | Wilson |
| D643,819 S | 8/2011 | Joo et al. |
| D646,647 S | 10/2011 | Chen et al. |
| 8,049,237 B2 | 11/2011 | Yamada et al. |
| 8,058,088 B2 | 11/2011 | Cannon et al. |
| D667,801 S | 9/2012 | Joo et al. |
| D671,509 S | 11/2012 | Moriguchi et al. |
| 8,425,071 B2 | 4/2013 | Ruud et al. |
| 8,563,339 B2 | 10/2013 | Tarsa et al. |
| 8,591,062 B2 | 11/2013 | Hussell et al. |
| 8,596,819 B2 | 12/2013 | Negley et al. |
| 8,622,584 B2 | 1/2014 | Kinnune et al. |
| 8,648,373 B2 | 2/2014 | Toyama |
| 8,669,581 B2 | 3/2014 | Jung et al. |
| 8,735,920 B2 | 5/2014 | Ibbetson et al. |
| 8,777,449 B2 | 7/2014 | Van De Ven et al. |
| 8,866,169 B2 | 10/2014 | Emerson et al. |
| 8,940,561 B2 | 1/2015 | Donofrio et al. |
| 9,024,349 B2 | 5/2015 | Chitnis et al. |
| 9,028,087 B2 | 5/2015 | Wilcox et al. |
| 9,048,396 B2 | 6/2015 | Lowes et al. |
| 9,070,850 B2 | 6/2015 | Keller et al. |
| 9,159,888 B2 | 10/2015 | Chitnis et al. |
| 9,182,096 B2 | 11/2015 | Kinnune et al. |
| 9,496,466 B2 | 11/2016 | Hussell et al. |
| 9,618,163 B2 | 4/2017 | Power et al. |
| 9,691,949 B2 | 6/2017 | Reiherzer et al. |
| 10,149,358 B1 * | 12/2018 | Tischler ................ H05B 45/46 |
| 10,453,825 B2 | 10/2019 | Reiherzer et al. |
| 2004/0208210 A1 | 10/2004 | Inoguchi |
| 2006/0131600 A1 | 6/2006 | Nakaoka et al. |
| 2006/0220050 A1 | 10/2006 | Higaki et al. |
| 2006/0278882 A1 | 12/2006 | Leung et al. |
| 2007/0170454 A1 | 7/2007 | Andrews |
| 2008/0258130 A1 | 10/2008 | Bergmann et al. |
| 2009/0085053 A1 | 4/2009 | Chen |
| 2009/0101897 A1 | 4/2009 | Murphy et al. |
| 2010/0078664 A1 | 4/2010 | Helbing |
| 2010/0102337 A1 * | 4/2010 | Lee .................... H05B 45/40 257/88 |
| 2010/0320482 A1 | 12/2010 | Tachibana |
| 2011/0031527 A1 | 2/2011 | Kotani et al. |
| 2011/0181173 A1 | 7/2011 | De Graaf et al. |
| 2011/0222285 A1 * | 9/2011 | Ye .................... H05B 45/40 362/249.02 |
| 2011/0266574 A1 | 11/2011 | Liao et al. |
| 2012/0051041 A1 | 3/2012 | Edmond et al. |
| 2012/0057327 A1 * | 3/2012 | Le ....................... F21V 3/02 362/84 |
| 2012/0061702 A1 | 3/2012 | Andrews et al. |
| 2012/0097997 A1 | 4/2012 | Chung et al. |
| 2012/0205689 A1 | 8/2012 | Welch et al. |
| 2012/0327650 A1 | 12/2012 | Lay et al. |
| 2013/0011946 A1 | 1/2013 | Hussell |
| 2013/0020600 A1 | 1/2013 | Yoo |
| 2013/0105835 A1 | 5/2013 | Wu et al. |
| 2013/0126927 A1 | 5/2013 | Iguchi |
| 2013/0257266 A1 | 10/2013 | Ishizaki |
| 2013/0279169 A1 | 10/2013 | Reiherzer et al. |
| 2013/0328073 A1 * | 12/2013 | Lowes .................... H01L 33/54 257/89 |
| 2014/0027795 A1 * | 1/2014 | Reiherzer ............. H01L 33/508 257/88 |
| 2014/0091341 A1 * | 4/2014 | Ou Yang ................ H01L 33/08 257/89 |
| 2014/0197396 A1 * | 7/2014 | Madigan ............. H01L 27/3246 257/40 |
| 2014/0203305 A1 | 7/2014 | Kawano et al. |
| 2014/0217433 A1 | 8/2014 | Tudorica et al. |
| 2014/0239325 A1 | 8/2014 | Andrews et al. |
| 2014/0347885 A1 | 11/2014 | Wilcox et al. |
| 2014/0355302 A1 | 12/2014 | Wilcox et al. |
| 2014/0363912 A1 * | 12/2014 | Ohlsson ................ H01L 33/30 438/35 |
| 2015/0016107 A1 | 1/2015 | Wimmer et al. |
| 2015/0253488 A1 | 9/2015 | Wilcox et al. |
| 2015/0349218 A1 | 12/2015 | Reiherzer et al. |
| 2016/0133610 A1 * | 5/2016 | Reiherzer ........... H01L 25/0753 257/98 |
| 2017/0018538 A1 * | 1/2017 | Tiwari ................ H01L 25/0753 |
| 2020/0043905 A1 | 2/2020 | Reiherzer |

FOREIGN PATENT DOCUMENTS

| | | | |
|---|---|---|---|
| EP | 3149779 A1 | 4/2017 | |
| EP | 3149779 B2 | 10/2019 | |
| KR | 10-2013-0087767 A * | 8/2013 | ............. H01L 33/48 |
| TW | I607585 B | 12/2017 | |
| WO | WO 2006/054616 A1 | 5/2006 | |
| WO | WO 2013/0148823 A1 | 10/2013 | |
| WO | WO 2015/184245 A1 | 12/2015 | |

OTHER PUBLICATIONS

Notice of Allowance for U.S. Appl. No. 14/538,526 dated Jun. 11, 2019.
Notice of Allowance for U.S. Appl. No. 29/492,456 dated Aug. 4, 2015.
Restriction Requirement for U.S. Appl. No. 14/292,331 dated Sep. 16, 2015.
International Search Report and Written Opinion for Application No. PCT/US2015/033153 dated Sep. 4, 2015.
Restriction Requirement for U.S. Appl. No. 14/538,526 dated Sep. 24, 2015.
Non-Final Office Action for U.S. Appl. No. 29/512,853 dated Dec. 14, 2015.
Non-Final Office Action for U.S. Appl. No. 14/292,331 dated Jan. 21, 2016.
Non-Final Office Action for U.S. Appl. No. 14/538,526 dated Mar. 24, 2016.
Taiwan Office Action for Application No. 104117211 dated May 12, 2016.
Notice of Allowance for U.S. Appl. No. 14/292,331 dated May 20, 2016.
Non-Final Office Action for U.S. Appl. No. 14/292,331 dated Oct. 13, 2016.
Final Office Action for U.S. Appl. No. 14/538,526 dated Oct. 17, 2016.
Taiwanese Office Action for Application No. 104117211 dated Nov. 29, 2016.
Notice of Allowance for U.S. Appl. No. 14/292,331 dated Feb. 16, 2017.
Notice of Publication for European Application No. 15727232 dated Mar. 8, 2017.
Non-Final Office Action for U.S. Appl. No. 14/538,526 dated Jul. 7, 2017.
Chinese Office Action for Application No. 2015800289601 dated Jun. 1, 2018.
Non-Final Office Action for U.S. Appl. No. 14/538,526 dated Jun. 13, 2018.
Advisory Action for U.S. Appl. No. 14/538,526 dated Feb. 14, 2019.
Chinese Office Action for Application No. 201580028960.1 dated Feb. 19, 2019.
Final Office Action for U.S. Appl. No. 14/538,526 dated Dec. 4, 2018.
Non-Final Office Action for U.S. Appl. No. 16/601,826 dated May 5, 2020.

* cited by examiner

LIGHT EMITTING DIODE (LED) COMPONENTS AND METHODS

TECHNICAL FIELD

The subject matter disclosed herein relates generally to light emitter components and methods. More particularly, the subject matter disclosed herein relates to light emitting diode (LED) components and related methods.

BACKGROUND

Light emitting diodes (LEDs) or LED chips are solid state devices that convert electrical energy into light. LED chips can be utilized in light emitter components or packages for providing different colors and patterns of light. Light emitter components can be mounted directly onto a surface of an underlying circuit component or heat sink for use in various lighting applications.

One problem with existing LED components is an inadequate viewing angle. Existing LED components, for example, existing surface mount design (SMD) components, have a full width at half maximum (FWHM) beam angle (e.g., an effective viewing angle) that is about 115°. This is not suitable for use in lighting bulbs applications and other high-power LED applications, such as, for example, projection or architectural lighting, which utilize wider FWHM beam angles for a more uniform light extraction. Manufacturers of LED lighting products are constantly seeking ways to provide components suitable for use in a plurality of different lighting applications, to encourage the adoption of LED products. One solution known in the art comprises using a translucent or transparent dam or other retention material to surround a transparent encapsulant while the encapsulant cures. However, while the dams may be formed from a transparent material, it is nevertheless possible for light to adversely interact with such transparent dams. For example, given the need for the dams in such known LED components to have a higher viscosity than the encapsulant, it is often the case that the dam material has a different refractive index from the encapsulant; as a result of the differences in the relative refractive indexes, the angle of the light exiting will change as the light passes from the encapsulant into the dam. Another disadvantage of such known LED components is that the dam and encapsulant may have poor adhesion with one another, whether inherently due to the types of materials used or from a manufacturing quality issue. In short, the dam adds complexity to the manufacturing process and can lead to reduced light extraction performance, quality issues, increased cost, and the like. LED Components incorporating fewer raw materials at sustained or increased brightness levels with uniform lighting are becoming more desirable.

Accordingly, and despite the availability of various LED components in the marketplace, a need remains for improved components and methods which can be produced quickly, efficiently, at a lower cost, and with larger viewing angles for more uniform lighting in light bulb and/or bulb applications. Such components can be single or multi-chip components, and their reduced cost and improved efficiency make it easier for end-users to justify switching to LED products from a return on investment or payback perspective.

SUMMARY

In accordance with this disclosure, novel light emitting diode (LED) components, systems, and methods are provided.

A light emitting diode (LED) component can comprise: a submount; first and second electrically conductive traces located on opposite sides of a first surface of the submount from each other and disposed only at least proximate to or at outer edges or the outer perimeter of the submount, wherein the plurality of electrically conductive traces extend at least a majority of a distance around all of the outer edges of the submount; a plurality of LED chips disposed on the first surface of the submount and spaced apart from the first and second electrically conductive traces, the plurality of LED chips comprising one or more red LED chips of a first size, one or more green LED chips of a second size, and one or more blue LED chips of a third size, at least one of the first size, the second size, and the third size being a different size; a plurality of wirebonds connecting the plurality of LED chips between the plurality of electrically conductive traces; and a molded encapsulant disposed on the first surface of the submount around the plurality of LED chips. Such a component can have a full width at half maximum (FWHM) beam angle that is, for example, greater than 125°. In such LED components, the one or more red LED chips collectively comprise a first total light-emitting area, the one or more green LED chips collectively comprise a second total light-emitting area, and the one or more blue LED chips collectively comprise a third total light-emitting area, each of the first, second, and third total light-emitting areas being substantially similar total light-emitting areas. In such LED components, the molded encapsulant has an at least substantially or entirely flat top surface, the molded encapsulant comprises lateral exterior walls that extend at least substantially or entirely to the outer edges of the submount to each be at least substantially or entirely co-planar with a lateral exterior wall of the submount. The LED component is devoid of a retention structure or wall laterally surrounding the molded encapsulant.

A light emitting system can comprise: a first LED component, a second LED component, and a third LED component, each of the first LED component, the second LED component, and the third LED component comprising: a submount; at least first and second electrically conductive traces located on opposite sides of a first surface of the submount from each other and disposed only at least proximate to or at outer edges or the outer perimeter of the submount; one or more LED chip disposed on a first surface of the submount; and a molded encapsulant disposed on the first surface of the submount around the one or more LED chip. Such a light emitting system can have a full width at half maximum (FWHM) beam angle that is greater than 125°. In such embodiments of the first, second, and third LED components, the molded encapsulant can have an at least substantially or entirely flat top surface, the molded encapsulant can comprise lateral exterior walls that can each extend at least substantially or entirely to the outer edges of the submount to be at least substantially or entirely co-planar with a lateral exterior wall of the submount. The LED component is devoid of a retention structure or wall laterally surrounding the molded encapsulant. Such a system can further comprise a controller. In such systems, the first LED component is configured to output a red light, the second LED component is configured to output a green light, and the third LED component is configured to output a blue light, so that the system is configured to output a mixed color light by controlling an activation of the first, second, and third LED components. Such a system can also further comprise a white LED or could have all LEDs and white LEDs.

A method of providing an LED component can comprise: providing a substantially flat submount; disposing first and second electrically conductive traces on opposite sides of a first surface of the submount from each other and disposed at least proximate to, or at outer edges of, the submount, wherein the first and second electrically conductive traces occupy a majority of the opposite sides on which the first and second electrically conductive traces are respectively located; attaching a plurality of LED chips over the first surface of the submount, the plurality of LED chips being spaced apart from the first and second electrically conductive traces and comprising one or more red LED chips of a first size, one or more green LED chips of a second size, and one or more blue LED chips of a third size, at least one of the first size, the second size, and the third size being a different size; electrically connecting, via wirebonding, each of the plurality of LED chips between the first and second electrically conductive traces; and then providing, such as for example by molding, at least an outer top surface of an encapsulant over the first surface of the submount and over the plurality of LED chips so that the outer top surface of the encapsulant is substantially flat, wherein the encapsulant comprises at least one lateral exterior wall that extends entirely to one of the outer edges of the submount. The LED component can have a full width at half maximum (FWHM) beam angle that is, for example, greater than 125°. In such an LED component provided according to the method herein, the one or more red LED chips collectively comprise a first total light-emitting area, the one or more green LED chips collectively comprise a second total light-emitting area, and the one or more blue LED chips collectively comprise a third total light-emitting area, each of the first, second, and third total light-emitting areas being substantially similar total light-emitting areas. In such an LED component provided according to a method herein, the molded encapsulant has an at least substantially or entirely flat top surface, the molded encapsulant comprises lateral exterior walls that each extend at least substantially or entirely to an outer edge of the submount to be at least substantially or entirely co-planar with a lateral exterior wall of the submount, and the LED component is devoid of a retention structure or wall laterally surrounding the molded encapsulant.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1:
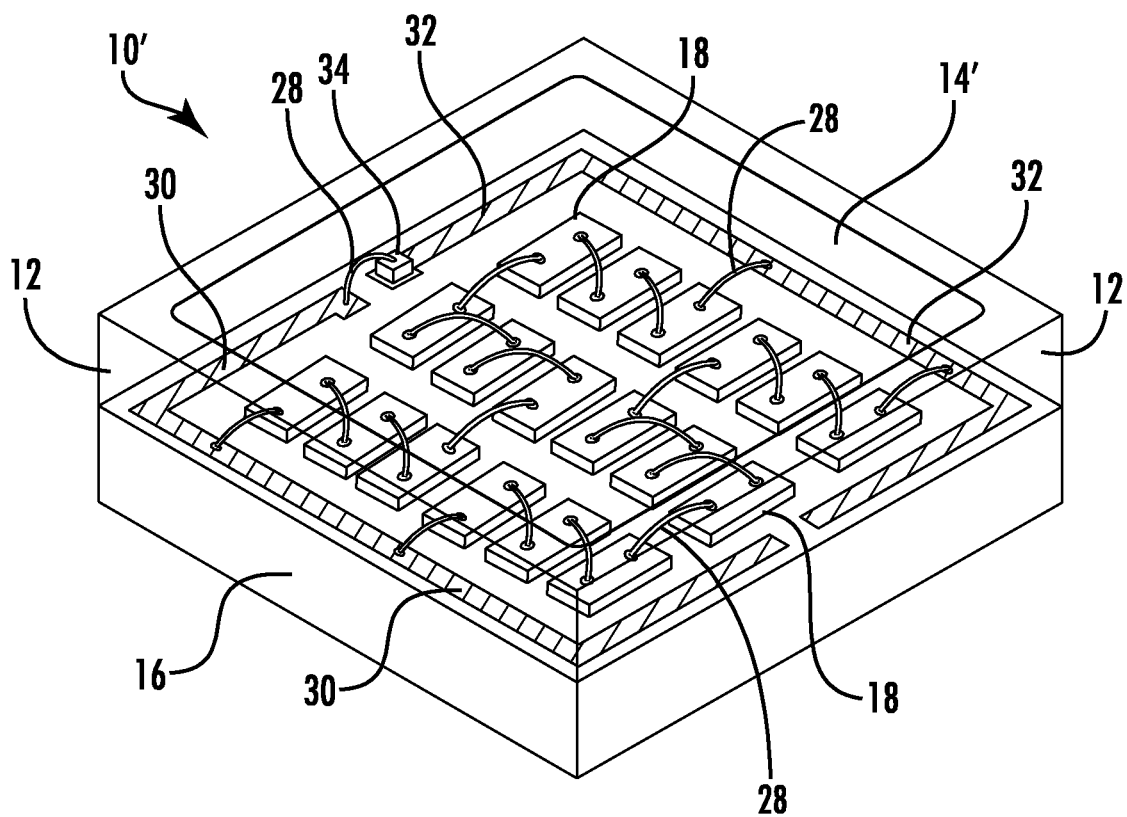
FIG. 1 is a perspective top view illustrating singulated LED components according to the prior art.

The subject matter disclosed herein is directed to light emitting diode (LED) components and methods.

LED components described herein can be submount based, and singulated from a larger panel of material, for example, a ceramic panel or substrate. This enables a plurality of different and/or customized components to be quickly and efficiently formed over the substrate and obviates the need for extensive processing (e.g., injection molding) and/or tooling. In some embodiments, LED components and methods described herein exhibit improved manufacturability and improved light extraction suitable for use in a wide variety of lighting applications, including and not limited to light bulbs.

In some embodiments, components herein comprise electrical contacts or traces that can comprise a minimized surface area over portions of the submount to reduce interference with light as described in commonly owned, assigned, and co-pending U.S. patent application Ser. No. 14/292,331, the content of which is incorporated by reference herein, in the entirety. The metallic can be spaced apart from one or more LED chip and disposed proximate the outermost edges of each individual submount for reducing interference with, absorption of, and/or potential blockage of light. Each trace can be disposed over a panel and below a wall, "dam", or other structure.

Reference will be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene.

References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the component in addition to the orientation depicted in the figures. For example, if the component in the figures is turned over, structure or portion described as "above" other structures or portions would now be oriented "below" the other structures or portions. Likewise, if components in the figures are rotated along an axis, structure or portion described as "above", other structures or portions would be oriented "next to" or "left of" the other structures or portions. Like numbers refer to like elements throughout.

Unless the absence of one or more elements is specifically recited, the terms "comprising", including", and "having" as used herein should be interpreted as open-ended terms that do not preclude the presence of one or more elements.

As used herein, the terms "through-hole", "thru-hole", and/or "via" are synonymous and refer an opening in the submount, often filled and/or lined (e.g., along one or more side walls) with an electrically conductive material that allows for an electrically conductive conduit or pathway between different layers, surfaces, or features of the component.

As used herein a "ceramic based material" or the term "ceramic based" includes a material that consists primarily of a ceramic material, such as an inorganic, non-metallic material made from compounds of a metal or metalloid and a non-metal (e.g., aluminum nitride, aluminum oxide, beryllium oxide, silicon carbide). A "non-ceramic based material" consists primarily a metallic material, a primarily organic (e.g., polymeric) material, and/or a primarily synthetic or semi-synthetic organic solid that can be dispensed or molded (e.g., plastic).

As used herein, the term "viewing angle" represents the luminous intensity of the LED component in space, which is characterized by an optical far field pattern (FFP). The viewing angle characterized by a FFP comprises a normalized luminous intensity ratio at different radiation angles. As used herein, the viewing angle is the angular extent to which the intensity of light emitted from the LED component is at least about 50% (e.g., full width at half maximum (FWHM)) of the intensity peak in a FFP.

Light emitter components according to embodiments described herein can comprise group III-V nitride (e.g., gallium nitride (GaN)) based LED chips or lasers. Fabrication of LED chips and lasers is generally known and only briefly described herein. LED chips or lasers can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si), and GaN.

Although various embodiments of LED chips disclosed herein can comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

LED chips according to some embodiments of the present subject matter, for example, can be fabricated on growth substrates (e.g., Si, SiC, or sapphire substrates) to provide horizontal devices (with at least two electrical contacts on a same side of the LED chip) or vertical devices (with electrical contacts on opposing sides of the LED chip).

Where used, the growth substrate can be maintained on the LED chip after fabrication or removed (e.g., by etching, grinding, polishing, etc.). The growth substrate can be removed, for example, to reduce a thickness of the resulting LED chip and/or to reduce a forward voltage through a vertical LED chip. A horizontal device (with or without the growth substrate), for example, can be flip chip bonded (e.g., using solder) to a carrier substrate or printed circuit board (PCB), or wirebonded. A vertical device (with or without the growth substrate) can have a first terminal (e.g., anode or cathode) solder bonded to a carrier substrate, mounting pad, or PCB and a second terminal (e.g., the opposing anode or cathode) wirebonded to the carrier substrate, electrical element, or PCB.

Examples of vertical and horizontal LED chip structures are discussed by way of example in U.S. Publication No. 2008/0258130 to Bergmann et al. and in U.S. Pat. No. 7,791,061 to Edmond et al. which issued on Sep. 7, 2010, the disclosures of which are hereby incorporated by reference herein in their entireties.

One or more LED chip can be at least partially coated with one or more phosphors. The phosphors can absorb a portion of light from the LED chip and emit light at a different wavelength such that the light emitter component emits a combination of light from each of the LED chip and the phosphor. In one embodiment, the light emitter component emits what is perceived as white light resulting from a combination of light emission from the LED chip and the phosphor. In one embodiment according to the present subject matter, white emitting components can consist of an LED chip that emits light in the blue wavelength spectrum and a phosphor that absorbs some of the blue light and re-emits light in the green, yellow, and/or red wavelength spectrum. The components can therefore emit a white light combination across the visible spectrum of light. In other embodiments, the LED chips can emit a non-white light combination of blue and yellow light as described in U.S. Pat. No. 7,213,940. LED chips emitting red light or LED chips covered by a phosphor that absorbs LED light and emits a red light are also contemplated herein. As referenced herein, "blue" light can comprise, for example, a wavelength between and including approximately 400 nanometers (nm) and approximately 490 nm, "green" light can comprise, for example, a wavelength between and including approximately 490 nm and approximately 570 nm, "red" light can comprise, for example, a wavelength between and including approximately 600 nm and approximately 750 nm, and "white" light can be between and including a cool white and a warm white, with a correlated color temperature (CCT) having a range between and including approximately 2,000 K and approximately 7,000 K at any color rendering index (CRI).

LED chips can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LED chip are described in U.S. Pat. No. 8,058,088 entitled "Phosphor Coating Systems and Methods for Light Emitting Structures and Packaged Light Emitting Diodes Including Phosphor Coating" which issued on Nov. 15, 2011, and the continuation-in-part application U.S. patent application Ser. No. 12/717,048 entitled "Systems and Methods for Application of Optical Materials to Optical Elements", the disclosures of which are hereby incorporated by reference herein in their entireties. LED chips can also be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety.

In some embodiments, panels, substrates, and/or submounts described herein comprise ceramic, and have a thermal conductivity of greater than approximately 5 W/mK, greater than approximately 10 W/mK, greater than approximately 50 W/mK, greater than approximately 100 W/mK, greater than approximately 150 W/mK, or greater than approximately 200 W/mK. In more particular embodiments, the thermal conductivity of panel substrates described herein can be approximately 20 W/mK (+ or −5 W/mK), such as for when the submount comprises alumina, or the thermal conductivity of the submount can be approximately 170 W/mK (+ or −5 W/mK), such as for when the submount comprises AlN.

It is understood that light emitter components and methods according to the present subject matter can also have multiple LED chips of different colors, one or more of which can be white emitting.

FIG. 1 illustrates an LED component, generally designated 10', according to the prior art. Such LED components 10' comprise submount based SMD components. LED component 10' comprises a submount 16. A plurality of electrically conductive traces 30 and 32 are provided over submount 16 for supplying current to LED chips 18. Traces 30 and 32 are disposed over a top side of submount 16. Traces 30 and 32 are covered with a retention structure 12. One or a plurality of LED chips 18 are attached to submount 16. LED chip or chips 18 are wirebonded for electrical connection to an anode and cathode source. Where there are a plurality of LED chips 18, they are wirebonded to each other and/or two electrically conductive portions of material 30, 32 such as for example by wirebonds 28, which are electrically conductive. LED chips 18 can be connected in series, in parallel, or in a combination of both series and parallel strings of LED chips 18.

LED component 10' comprises an ESD protection device 34 electrically connected to traces 30 and 32 via a wirebond 28 and mounted over submount 16. ESD protection device 34 is covered by retention structure 12. Wirebonds 28 extending from ESD protection device 34 and LED chips 18 terminate under portions of retention structure 12. Retention structure 12 can comprise an opaque or light transmissive wall or dam. In such prior art devices, it is necessary to ensure that the height of the dam is greater than the height of the LED chips 18 so that the LED chips 18 can be covered entirely with encapsulant 14'. Encapsulant 14' is provided over submount 16 and retained via internal walls of retention structure 12. Encapsulant 14' is dispensed between portions of at least two opposing walls of retention structure 12.

Referring to FIGS. 2 through 17E, example embodiments of an LED component are disclosed.

Figure 2:
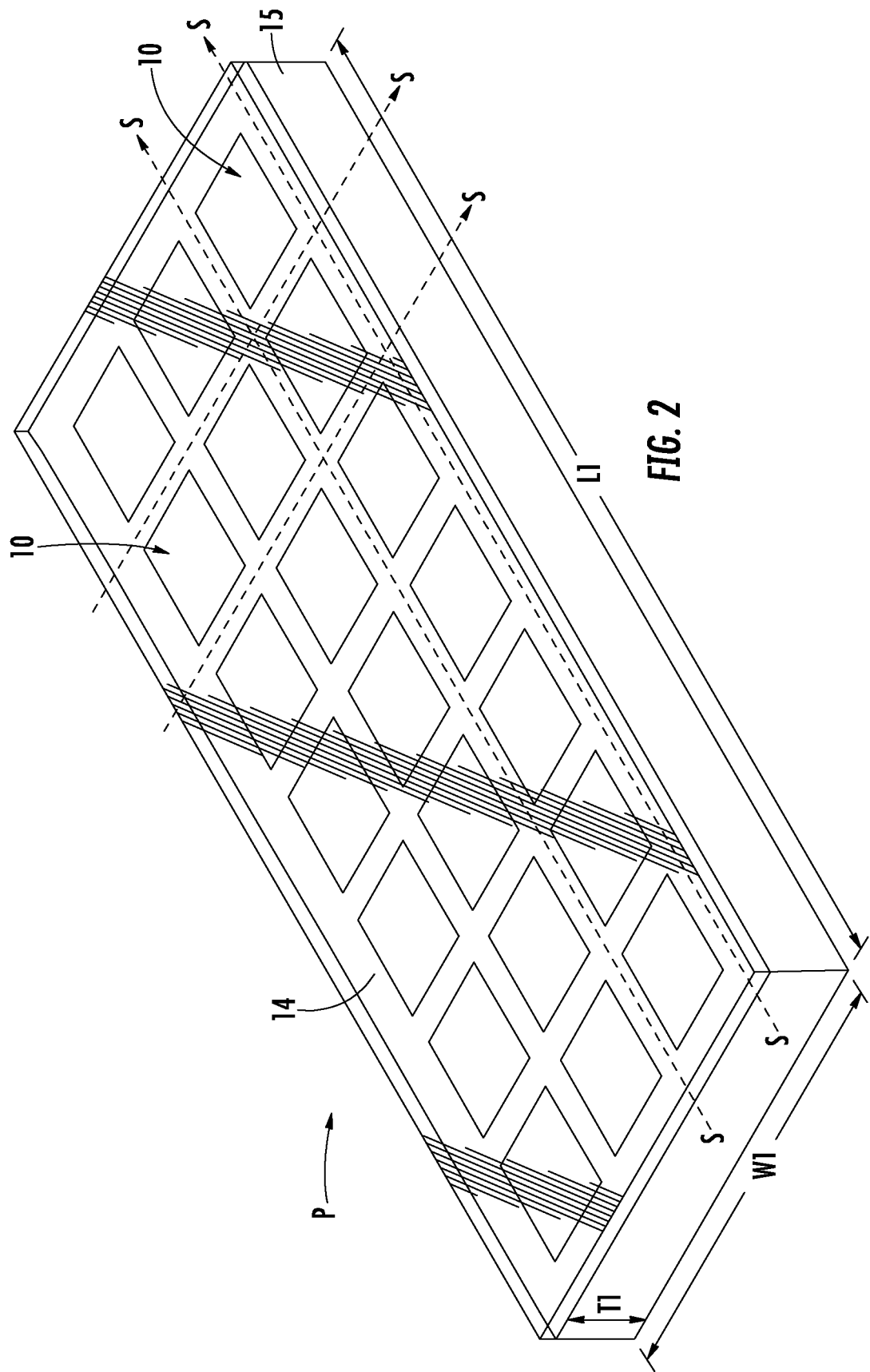
FIG. 2 is a perspective view illustrating an example embodiment of a panel of LED components, or portions thereof, prior to singulation, according to the disclosure herein.

Referring in general to FIG. 2, one or a plurality of LED components, generally designated 10, can be provided and/or formed over a substrate or panel, generally designated P. One or more individual LED components 10 can be formed over and then singulated, separated, and/or otherwise physically isolated from panel P. In some embodiments, a plurality of submount based SMD components 10 can be formed over panel P.

In some embodiments, panel P, and portions thereof, form the building blocks for the novel LED components provided herein, as customized LED components can easily be formed or provided over panel P. For example, and as FIG. 1 illustrates, LED components 10 can comprise a layer of molded encapsulant 14 that is not contained within voids defined by a dispensed retention structure of dam (see, e.g., 12, FIG. 1), but is instead a substantially continuous layer formed over the upper surface of submount 15 to constitute an outer surface of each LED component 10. Any size and/or shape of LED components 10 can be provided. Notably, multiple LED components 10 can be formed and/or batch processed over panel P and later separated therefrom. One or more individual LED components 10, or products incorporating LED components 10, can then be sorted and shipped to customers or consumers based upon electrical and/or optical properties.

In some embodiments, panel P comprises a substrate 15 comprising any suitable length, such as, for example and without limitation, a length L1 of approximately 4 inches (") and any suitable width, such as, for example and without limitation, a width W1 of approximately 2" (e.g., an area of 4"×2") such that approximately 120 LED components having individual submounts (e.g., 16, FIG. 3) of approximately 5 mm×5 mm can be formed thereon and/or singulated therefrom. In some embodiments, more than 500 LED components can be formed on panel P. Other LED chip dimensions are contemplated as well. In other embodiments, panel P is approximately 5 inches (") in length L1 and/or width W1, approximately 4" in length L1 and/or width W1, approximately 3" in length L1 and/or width W1, or approximately 2" in length L1 and/or width W1. However, any size and/or shape of panel P can be provided.

Figure 3:
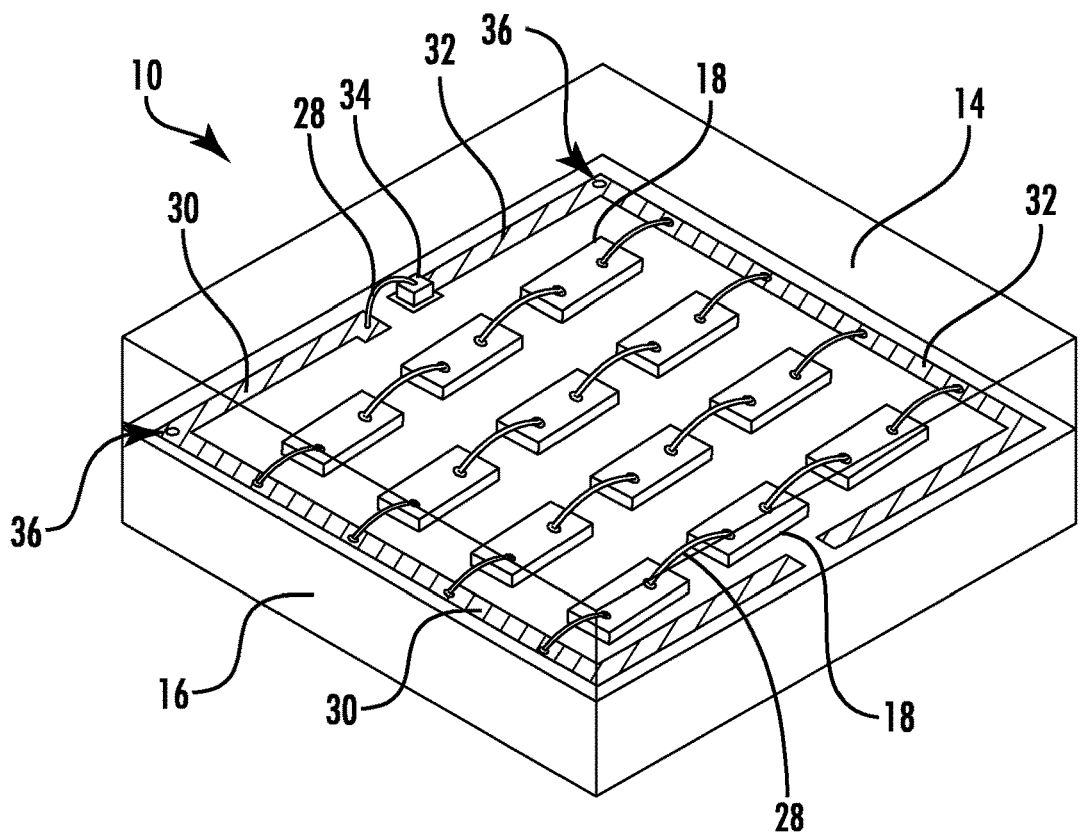
FIGS. 3 and 4 are perspective top views illustrating a singulated LED component, according to the disclosure herein.

In some embodiments, panel P can be singulated (e.g., cut, sawn, diced, broken, laser cut, etched, etc.) such as along singulation lines S into individual LED components 10 having individual submounts (e.g., 16, FIG. 3). Any size and/or number of LED components 10 can be formed upon and singulated from panel P. Each LED component 10 can comprise an individual submount (e.g., 16, FIG. 3) that can be, for example and without limitation, square and larger or smaller than 5 mm per side (e.g., greater than or equal to 50 mm per side, 40 mm per side, 30 mm per side, 20 mm per side, 10 mm per side, 8 mm per side, 7 mm per side, 4 mm per side, 3 mm per side, or less than 3 mm per side, etc.). Non-rectangular and non-square panels P and components, respectively, can also be provided. Any combination of submount size/shape (e.g., 16, FIG. 3) can be provided.

Still referring in general to FIG. 2 and in some embodiments, substrate 15 of panel P can comprise any suitable height or thickness, such as for example any thickness T1 between approximately 0.1 mm and 5.0 mm. For example, in some embodiments, substrate 15 comprises a thickness T1 of approximately 2 mm or less, approximately 1 mm or less, approximately 0.8 mm or less, or approximately 0.5 mm or less. In some embodiments, substrate 15 is approximately 0.635 mm thick. In other embodiments, substrate 15 is approximately 0.35 mm thick or more. As noted above, any size and/or shape of panel P can be provided. In the embodiment shown, LED components 10 are schematically shown as being separated from each other before singulation of the panel P to more clearly illustrate the positions of the example singulation lines S, but in some embodiments LED components 10 can be contiguous and/or uninterrupted, such that the edges of adjacent LED components 10 contact each other. LED components 10 can be of any size on panel P and adjacent edges of adjacent LED components 10 can be arranged so as to be co-linear with each other (e.g., a singulation line S and the edges of each LED component 10 may be co-linear, so that the LED components 10 extend all the way to the adjacent singulation line(s) S).

Substrate 15 of panel P can comprise any metallic or non-metallic material. In some embodiments, panel P comprises a highly reflective material, such as a white, silver, or transparent ceramic based material configured to improve light extraction and reflectance. Panel P can comprise a highly reflective aluminum oxide (e.g., alumina or $Al_2O_3$) or aluminum nitride (AlN) panel with reflective particles dispersed or doped therein. Panel P can also comprise any suitable oxide ceramic such as zirconium oxide, or zirconia ($ZrO_2$), or a mixture, composite or alloy of zirconia and/or alumina. Panel P can comprise a powder based (e.g., "green") ceramic that is pressed and fired prior to attachment of one or more LED chip (18, FIG. 3). Panel P can comprise at least one substantially flat or planar surface over which the one or more LED chip (18, FIG. 3) can be supported, mounted, and/or attached.

Notably, LED components 10 provided herein can be efficiently batch formed and/or batch processed over panel P, to thereby simultaneously form a plurality of customized packages that are submount based and provided at lowered costs and/or have improved manufacturability. Notably, LED components 10 formed over panel P can be created without the use of a retention structure or dam (see, e.g., retention structure 12, FIG. 1), for further increasing a viewing angle associated with the LED components 10 from the prior art LED component 10' shown in FIG. 1. In some embodiments, LED components 10 include a wider viewing angle that is greater than 125°, which renders the LED components 10 especially well suited and/or operable for light bulb or bulb type applications (see e.g., FIGS. 17A-17E), as well as other high-power light emitting applications, such as projection and/or architectural lighting.

That is, customized LED components 10, which are customized with regard to size, shape, color, number, and/or connectivity of LED chips, traces (e.g., customized size, shape, and/or placement thereof), and/or optical elements (e.g., customized shape, size, placement, surface features, etc.) can be provided as a batch over panel P, and batch processed. Aspects of the LED chips, traces, retention structures and/or optical elements can be customized to provide light emitter components operable at various electrical and/or optical specifications per customer and/or consumer requests. LED components 10 can be customized in regard to a beam shape, a beam size, a beam direction, and/or a color temperature, or, for monochromatic components that are not on the blackbody curve, a wavelength is described in commonly owned and co-pending U.S. patent application Ser. No. 14/538,526, the content of which is and was incorporated herein by reference in the entirety above, panel P can be highly reflective to visible light (e.g., greater than about 90%) and provide conduction of heat as well as mechanical support. In some embodiments, non-metallic and/or ceramic materials containing $Al_2O_3$ exhibit such qualities. Accordingly, panel P (i.e., and individual submounts (16, FIG. 3) singulated therefrom can comprise a ceramic based body of material comprising $Al_2O_3$. Panel P can also comprise any of a variety of optional light scattering particles contained therein. Examples of suitable scattering particles can for example comprise particles of $Al_2O_3$, $TiO_2$, $BaSO_4$, $ZrO_2$, and/or AlN.

In some embodiments, panel P is similar to and/or provided using methods described in U.S. utility patent application Ser. No. 11/982,275, filed Oct. 31, 2007 and/or U.S. utility patent application Ser. No. 12/757,891, filed Apr. 9, 2010. The entire contents of each of these references are hereby incorporated by reference herein.

In some embodiments, each layer of encapsulant 14 can be provided, such as molding each or all of the layers of encapsulant 14, over panel P after providing traces (e.g., 30, 32, FIG. 3), other components (e.g., chip 34, FIG. 3), and after die-attaching and optionally wirebonding LED chips (e.g., 18, FIG. 3). Encapsulant 14 can be provided, such as dispensed, and molded over the entirety of panel P via a dispensing tool and molded by a substantially flat press that is configured to apply heat and/or pressure to cure the encapsulant to have a substantially flat (e.g., not domed) surface after curing, to cover such components. In some embodiments, at least a portion of, only a portion of, or all of the encapsulant 14 can be molded. At least some or all of an outer top surface of the encapsulant 14 can be molded to be substantially flat (e.g., within the selected tolerances for a molding element to eliminate meniscus-forming features from the outer top surface of the encapsulant 14 after molding). In some embodiments, the lateral outer walls of encapsulant 14 can be molded in addition to the outer top surface of encapsulant 14. Encapsulant 14 can, in some embodiments, entirely and completely surround LED chips 18. Encapsulant 14 can comprise any suitable translucent material that can be cured through a molding process, including, but not limited to, a silicone encapsulant, with or without optical conversion material (e.g., phosphor(s), lumiphor(s), etc.). In some embodiments, the LED components 10 can be devoid of any phosphors or other color-shifting elements so that each LED component 10 provides a single wavelength output of light. In some embodiments, the translucent material can be a clear silicone or other suitable transparent encapsulant, a phosphor-loaded silicone, a silicone loaded with reflective particles to produce a light transmissive diffusive material, or combinations thereof. In some other embodiments, a clear, translucent, or opaque (e.g., white and/or black) retention material (see, e.g., 12, FIG. 1) can be used in conjunction with the encapsulant 14 of such embodiments, with the encapsulant 14 being molded within the cavity formed by the retention material.

Encapsulant can be dispensed over the surface of the panel P and can be molded by a substantially flat press (e.g., a press that has an acceptable flatness tolerance) that applies heat and/or pressure to cure/mold the encapsulant in a substantially uniformly flat layer to cover the LED chips (e.g., 18, FIG. 3). Exterior singulation lines S are provided such that any encapsulant 14 that protrudes beyond the lateral edges of the panel P is trimmed away to provide the precise shape of LED components 10. Notably, the LED components 10 are devoid of retention structures, dams or walls (e.g., 12, FIG. 1), so that encapsulant 14 is not retained within a specifically defined cavity, unlike the embodiments illustrated and described relative to FIG. 1. The omission of such a retention structure or dam increases the viewing angles associated with LED components 10 over LED components that utilize such retention structures or dams because, while such retention structures may be transparent, light can still adversely interact with such structures. For example, it is common for such retention materials to have a different refractive index from that of the encapsulant (e.g., 14', FIG. 1) and, in such cases, the angle of the exiting light will necessarily change at the interface region between these structures. Another disadvantage that is remedied by the use of an encapsulant that is formed without a retention structure is that the retention structures and encapsulant may have poor adhesion with one another.

In some embodiments and upon singulation, panel P is cut, sawn, diced, laser cut, etched, or otherwise separated along singulation lines S, which are shown in broken lines for illustration purposes, such that encapsulant 14 is contiguous and/or co-planar with each of the edges of the submount 16 to form external surfaces or lateral walls of individual LED components 10. In some embodiments, encapsulant 14 can, but does not have to, comprise a same size and/or shape as the individual submounts (e.g., 16, FIG. 3) of substrate 15. Submount 16 can be square, rectangular, circular, elliptical, or any other suitable rectilinear shape. Encapsulant 14 is, in the embodiment shown, molded such that at least one wall or all of the walls, shown being at least substantially vertically oriented, extend at least substantially or entirely to an outer edge or outer perimeter of the submount to be at least substantially or entirely co-planar with the corresponding outer wall of the submount 16. In such embodiments, each of the outer walls of encapsulant 14 extend to be co-planar with the outer walls of the submount 16.

In some embodiments, encapsulant 14 comprises a polymeric and/or plastic material. In some embodiments, encapsulant 14 is devoid of any color or pigment. Encapsulant 14 can comprise a matrix of transparent (e.g., transmissive to light) or clear silicone or epoxy with one or more binders dispersed therein. Encapsulant 14 can, but does not have to, contain and/or be coated with an amount of wavelength conversation material (e.g., phosphor(s)) while remaining devoid of reflective particles and/or reflective properties. That is, encapsulant 14 can be non-reflective, and instead allow light to readily pass therethrough. Encapsulant 14 can be at least partially, if not fully, transparent for readily emitting light therefrom and/or allowing light to pass therethrough. This can advantageously result in a larger viewing angle and increased demand and use of such LED components. Transparent encapsulant 14 also enables LED components 10 to accommodate a larger number of lighting applications (e.g., energy efficient bulbs, FIG. 4). In some embodiments, encapsulant 14 is a translucent material, which can be a clear silicone or other suitable encapsulant (which is transparent), a phosphor-loaded silicone, a silicone loaded with reflective particles to produce a light transmissive diffusive material, or combinations thereof.

Encapsulant 14 can be provided in various thicknesses or heights vertically disposed with respect to panel P. In some embodiments, encapsulant 14 comprises a single layer of material. In other embodiments, encapsulant 14 comprises multiple layers of material, and can be dispensed in more than one layer via dispensing tool. Encapsulant 14 is shown to be substantially uniform in height, but in some embodiments can vary in height across panel P. Encapsulant 14 can, for example as shown particularly in FIG. 3 and other figures also, have an at least substantially or entirely flat, upper surface without any other lens or hemispherical dome formed on or attached to the top surface of the encapsulant 14. In this manner, encapsulant 14 is devoid of any dome or lens beyond the upper surface provided by encapsulant 14. In some embodiments, a surface texturization or modulating surface profile can be formed in the upper surface of encapsulant 14 by the surface texturization or modulating surface profile being formed in a side of the press that contacts encapsulant 14 while molding and curing encapsulant 14.

In some embodiments, encapsulant 14 can comprise, without limitation, a transparent or clear silicone, epoxy, etc. having light-permeable binders or fillers therein, including but not limited to fumed silica, silica gel, nanomaterials (e.g., nano-binders or nano-fillers), ceramic nanoparticles, ceramic micro-particles, quantum dots, phosphor, ceramic fiber(s), non-ceramic fiber(s), combinations thereof, or any other suitable filler(s) and/or binder(s).

The broken lines in FIG. 2 illustrate separation or singulation lines S, along which adjacent LED components 10 and respective submounts (e.g., 16, FIG. 3), are singulated or separated from each other. After or before the encapsulant 14 is cured, the singulation lines S may be formed in, or drawn/etched into, the upper surface of the encapsulant 14 to indicate the boundaries of each LED component 10. Individual LED components 10 can be separated from each other via sawing, breaking, dicing, shearing, scribing, machining, cutting, grinding, laser cutting, etching, combinations thereof, and/or any other suitable process. As FIG. 2 illustrates, singulation lines S can extend through portions of molded encapsulant 14, such that upon singulation, encapsulant 14 is cut into, for forming interior and/or exterior walls (e.g., lateral edges) of the one or more individual LED components 10.

As used herein, the term batch processes or batch processing refers to one or more processing steps, not limited to depositing traces (e.g., electroplating, deposition, electroless plating, etc.), die attaching LED chips, wirebonding LED and/or ESD chips, forming electrically conductive vias (e.g., 36, FIG. 3), dispensing encapsulant 14, molding optional optical elements, curing, and/or individual component singulation.

Figure 4:
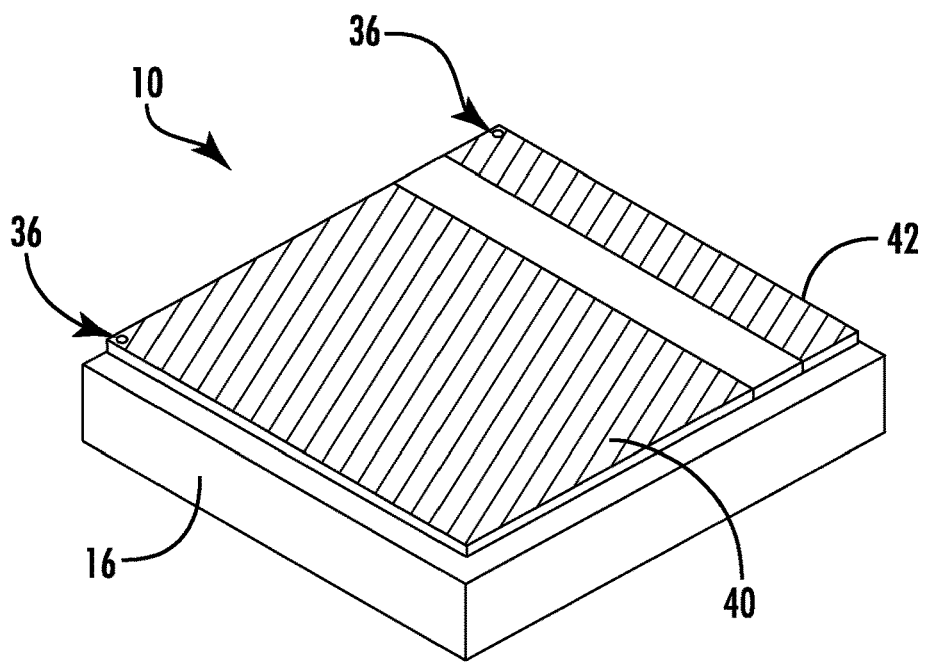
Figure 5:
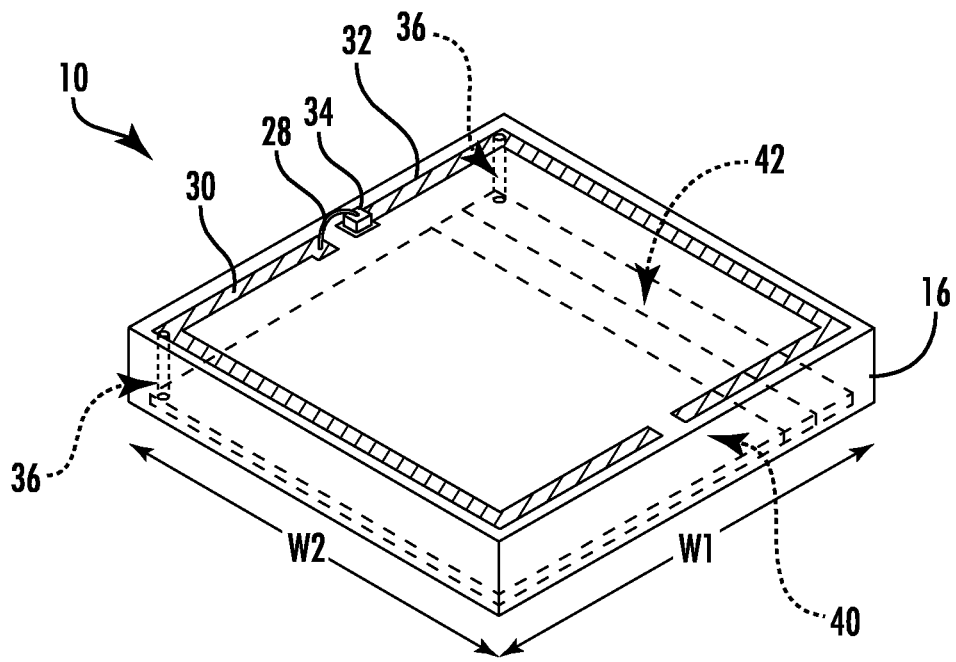
FIG. 5 is a perspective top view illustrating a substrate of a LED component without LED components attached thereto, according to the disclosure herein.
Figure 6:
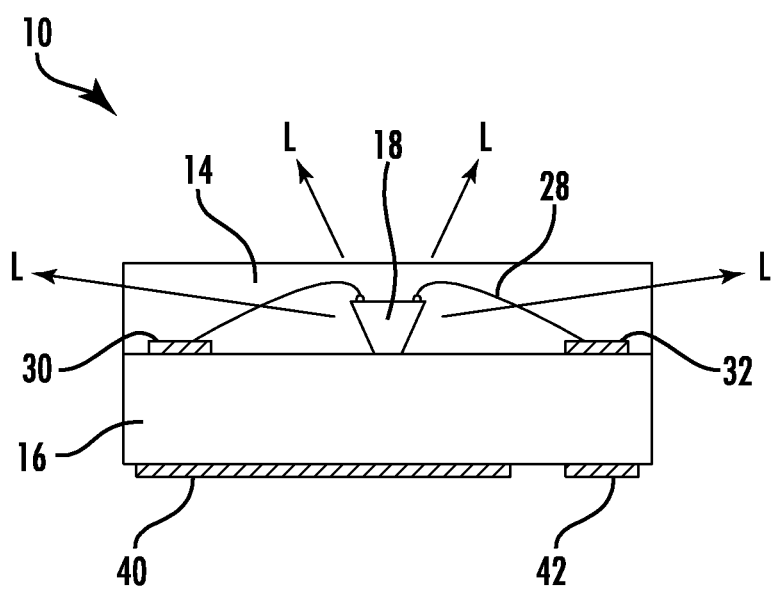
FIG. 6 is a sectional view illustrating an LED component, according to the disclosure herein.

FIGS. 3 and 4 illustrate an individual, singulated LED component 10. FIG. 5 illustrates a submount 16 of an LED component 10 without the LED chips or encapsulant being formed thereon to better illustrate construction of submount 16. FIG. 6 is a sectional view associated with LED component 10; however, for illustration purposes FIG. 6 illustrates only one LED chip 18. LED component 10 can be separated from panel P (FIG. 2) and other, adjacent components after processing the plurality of components, or portions thereof, as a group or batch, thereby improving manufacturability of each LED component 10.

Referring to FIG. 3, LED component 10 comprises a submount 16, which is singulated from a portion of panel P. Submount 16 can comprise a highly reflective and non-metallic ceramic or other suitable material as disclosed herein. At least one LED chip 18 can be die attached to submount 16 and, in some aspects, a plurality of LED chips 18 are die attached to submount 16. LED chips 18 can be die attached directly or indirectly to submount 16 using any suitable material, such as silicone, epoxy, solder, adhesive, tape, etc.

LED chips 18 can be wirebonded to each other and/or one or more electrically conductive portions of material (e.g., component contacts of terminals) via wirebonds 28. In such embodiments, die-attached LED chips 18 are not used, as they are incompatible with electrical connections through wirebonds 28. Wirebonds 28 can comprise any electrically conductive material such as a metal, a metal alloy, Au, Al, Sn, Ag, Cu, etc. LED chips 18 are linearly arranged into a plurality of strings of linearly-arranged LED chips that extend between and are connected to traces 30 and 32, which are disposed on opposite sides of the submount 16. LED chips 18 can be serially connected, connected in parallel, and/or combinations thereof between anode/cathode contacts or terminals (e.g., traces 30 and 32).

Multiple LED chips 18, where provided, can be configured to emit a same wavelength or chromaticity (see, e.g., FIGS. 7A through 7C), or different colors of light (see, e.g., FIGS. 8A through 11). LED chips 18 can, for example, be configured to emit single-wavelength light that is one of primarily blue (see, e.g., FIG. 7A), blue shifted yellow (BSY), cyan, green (see, e.g., FIG. 7B), red (see, e.g., FIG. 7C), yellow, red-orange, orange, amber, and/or white (e.g., 2500-9000K). Any color of LED chip 18 can be provided. LED chips 18 can be configured to activate a yellow, red, and/or green phosphor disposed directly over LED chip 18 and/or over or within a portion of molded encapsulant 14 for producing cool and/or warm white output. In some embodiments, LED components 10 can be devoid of a wavelength conversion material (e.g., a luminophoric medium), such as one or more phosphor(s). In some embodiments, a layer of wavelength conversion material can be provided over an upper surface of the submount 16 and/or an upper surface of one or more (e.g., all, or a plurality of) LED chips 18.

LED chips 18 can comprise any size and/or shape. LED chips 18 can be substantially square, rectangular, regular, irregular, or asymmetrical in shape. In some embodiments, LED chips 18 can, for example and without limitation, comprise a footprint where at least one side (e.g., a length or width) measures more than 2000 µm or approximately 2000 µm or less, such as approximately 1000 µm or less, approximately 900 µm or less, approximately 700 µm or less, approximately 600 µm or less, approximately 500 µm or less, approximately 400 µm or less, approximately 300 µm or less, approximately 200 µm or less, approximately 100 µm or less, and/or combinations thereof where multiple LED chips 18 are used. Any dimension of LED chip(s) 18 can be provided.

A plurality of electrical contacts, such as electrically conductive traces 30 and 32, can be provided over panel P (FIG. 2) and each submount 16 that is singulated therefrom. In some embodiments, the plurality of electrically conductive traces 30 and 32 comprises a pair of electrical contacts (e.g., an anode/cathode pair) for supplying current to LED chips 18 disposed therebetween and/or electrically connected thereto. Electrically conductive traces 30 and 32 can comprise areas of electrically conductive material, such as metal or a metal alloy, which can be plated or otherwise deposited (e.g., physically, chemically, CVD, PECVD, etc.) over submount 16. In some embodiments, electrically conductive traces 30 and 32 are disposed over a top side or surface of submount 16 via sputtering, electroplating, electroless plating, depositing (e.g., chemical, plasma, vapor, and/or physical deposition), lithography processing, photoresist processing, stenciling, and/or any other suitable process or technique. Electrically conductive traces 30 and 32 can be thin and optionally comprise one or more layers of material. Electrically conductive traces 30 and 32 can be, but do not have to be, disposed proximate to outermost areas of submounts 16 formed from panel P, and covered with encapsulant 14. The size, shape, number, location, thickness, and/or material of electrically conductive traces 30 and 32 can be customized for use in various lighting applications.

Still referring to FIG. 3, LED component 10 can further comprise at least one ESD protection device 34 electrically connected to electrically conductive traces 30 and 32 via one or more wirebonds 28. In some embodiments, ESD protection device 34 can be connected to traces 30 and/or 32 by a direct-attach technique, by bonding with solder, and the like. ESD protection device 34 can comprise a vertically structured device (e.g., opposing bond pads) that is reversed biased or electrically connected in reverse polarity to LED chips 18. ESD protection device 34 can, for example, comprise a vertical silicon (Si) Zener diode, a dual back-to-back Zener diode, a different LED chip arranged in parallel and reverse biased to light emitting LED chips 18, a surface mount varistor, and/or a lateral Si diode. Horizontally structured ESD protection devices 34 (e.g., adjacent bond pads) can also be provided.

ESD protection device 34 can be mounted over submount 16 using any known material and/or technique. ESD protection device 34 can be smaller than LED chips 18 so that it does not occupy an excessive area of submount 16. ESD protection device 34 can also be covered by an encapsulant 14 that can be formed by molding at least the outer top surface of the encapsulant 14 using a molding element (e.g., with the ESD protection device 34 being proximate to or at an edge of LED component 10). ESD protection device 34 can prevent excessive current from passing through LED component 10 during an ESD event by providing an alternative path for current to flow besides the LED chips 18. Wirebond 28 extending from ESD protection device 34 and/or LED chips 18 can terminate under, below, and/or within portions of the molded encapsulant 14. In some embodiments, LED component 10 comprises an SMD in which electrically conductive traces 30 and 32, wirebonds 28, and/or ESD protection device 34 are covered (e.g., fully or at least partially) by and/or within molded encapsulant 14. LED component 10 can be devoid of uncovered electrically conductive traces 30 and 32 on a top surface thereof. In some embodiments, at least a portion of, only a portion of or all of the encapsulant 14 of each LED component 10 can be, as described hereinabove relative to FIG. 2, formed and/or molded (e.g., at an outer top surface thereof) over a plurality of LED components 10 before the individual LED components 10 are singulated from panel P. In some other embodiments, encapsulant 14 can be formed individually over a single submount 16 (e.g., after singulation of submount 16 from panel P). In some embodiments, the lateral outer walls of encapsulant 14 can be molded in addition to the outer top surface of encapsulant 14.

Electrically conductive vias, generally designated 36, can optionally be provided within portions of panel P (FIG. 2) and each submount 16 that is singulated therefrom. Vias 36 can comprise a plurality of openings, apertures, and/or holes extending internally within panel P and each submount 16 that is singulated therefrom. Vias 36 can be, but do not have to be, vertically aligned or parallel with respect to the vertical axis of a submount thickness (e.g., which corresponds to panel thickness T1, FIG. 2). Vias 36 can be filled and/or plated with electrically conductive material, such that top contacts or traces 30 and 32 can electrically communicate with bottom contacts or traces (e.g., 40 and 42, FIG. 4). Bottom traces (e.g., 40 and 42) can be disposed or attached on a back side of panel P and respective submounts 16, which oppose the surface of the submounts 16 upon which LED chips 18 are provided. A plurality of bottom traces (e.g., 40 and 42) can be provided on or over panel P prior to singulation of individual LED components 10.

Referring to FIG. 4 and, in some embodiments, LED component 10 comprises first and second electrical contacts 40 and 42 disposed on a bottom surface of submount 16. First and second contacts 40 and 42 can be physically (e.g., and also electrically) separated from each other. Contacts 40 and 42 can comprise SMD pads or contacts configured to electrically communicate directly with an external circuit, and optionally thermally communicate with an external heat sink. In some embodiments, the circuit is also the heat sink. In other embodiments, the heat sink and circuit can comprise separate components.

First and second contacts 40 and 42 can electrically communicate to or with traces 30 and 32, respectively, using the one or more internally disposed thru-holes or vias 36. Vias 36 can extend internally within a portion of submount 16 depending upon how formed within panel (e.g., P, FIG. 2) and how panel is subdivided into individual submounts 16. Vias 36 can comprise conduits for transferring electrical current between first and second bottom contacts 40 and 42 and respective traces 30 and 32. Vias 36 also comprise conduits for passing electrical current to and from LED chips 18 within LED component 10.

Referring to FIGS. 3 through 17E in general, at least one or more LED chip 18 is provided between each pair of traces 30 and 32. In some embodiments, multiple LED chips 18 are provided between each pair of traces 30 and 32. Any desired connectivity of LED chips 18, including combinations of serially and parallel connected chips, can be provided within LED component 10. In the embodiment shown, the LED chips 18 are connected, using a plurality of wirebonds 28, into individual linearly-arranged strings of LED chips, each such string being electrically connected at each end thereof between an anode (e.g., trace 30) and cathode (e.g., trace 32) by a wirebond 28. LED chips 18 can be visible through encapsulant 14 from outside component 10, as encapsulant 14 is non-opaque, clear, and/or transparent. In the embodiment shown, encapsulant 14 is formed from a translucent material, which can be a clear silicone or other suitable transparent encapsulant, a phosphor-loaded silicone, a silicone loaded with reflective particles to produce a light transmissive diffusive material, or combinations thereof. Encapsulant 14 is molded over a portion or all of the upper surface of the LED component 10 without a retention structure being provided to contain encapsulant 14. The size, shape, structure, color, number, and/or connectivity of LED chips 18 provided between traces 30 and 32 can be customized for use in various lighting applications. Various combinations of LED chips 18 and phosphors can also be provided, for providing a desired color and light output from LED component 10.

Encapsulant 14 can have any suitable thickness and/or height. In some embodiments, the thickness of the encapsulant 14 can be any value between approximately 0.1 and 2.0 mm, however, any thickness can be provided. Encapsulant 14 can comprise a height having any value between approximately 0.1 mm and 3.0 mm. The height and the thickness of the encapsulant 14 can be independent of each other. The height of the encapsulant 14 can, in some aspects, be directly correlated with the height of the LED chips in the package (e.g., for a flat package), as the height of the encapsulant 14 should be above the height of the LED chips so that the LED chips can be covered entirely with encapsulant 14.

In one aspect, the height range of the encapsulant 14 can be from approximately 0.2 mm to 5.0 mm and the thickness of the encapsulant 14 can be from approximately 0.1 mm to 5.0 mm.

Still referring in general to FIGS. 3 through 17E, encapsulant 14 is molded over submount 16. In some embodiments, encapsulant 14 is dispensed over the upper surface of panel P via a dispensing tool or dispenser and then molded (e.g., cured) by a substantially flat curing tool that is configured to apply heat and/or pressure to cure the encapsulant 14. Encapsulant 14 can be devoid of or comprise an optical element for producing a certain shape, color, and/or beam pattern of light. Encapsulant 14 can comprise a planar surface, a curved surface, a domed surface, or combinations thereof. In some embodiments, encapsulant 14 comprises an encapsulant, where at least a portion of the encapsulant is disposed on a same side or surface of submount 16 to which LED chips 18 are mounted, and/or a same side or surface to which electrically conductive traces 30 and 32 are deposited. Encapsulant 14 is formed directly and/or indirectly over a top surface of submount 16 and disposed directly over the at least one LED chip 18. An array of lenses, domes, or optical elements comprising encapsulant 14 can be dispensed and/or positioned over panel P (FIG. 2) from which individual LED components 10 are singulated. In some embodiments, the curing tool is configured to form a surface texturization or modulating surface profile in or on the upper surface of encapsulant 14 by the surface texturization or modulating surface profile being formed in a side of the curing tool (e.g., press) that contacts encapsulant 14 while molding and curing of the encapsulant 14 is being performed.

In some embodiments, encapsulant 14 comprises a silicone matrix, encapsulant, or plastic material, which can be deposited or dispensed directly over panel P and respective submounts 16 without incurring time or expense associated with overmolded lenses. Encapsulant 14 can be formed to have any height and cured prior to singulation of individual components 10 from panel P (FIG. 2). Encapsulant 14 is molded (e.g., to have an at least substantially or entirely flat exterior surface) and then the individual LED components 10 are singulated from panel P. In some embodiments, rather than molding the encapsulant 14 over an entire panel P, encapsulant 14 may be molded over the submount 16 of an LED component 10 after singulation of the submount 16 from the panel P.

Encapsulant 14 can provide both environmental and mechanical protection of individual LED components 10. In some embodiments, an optional layer of optical conversion material(s), such as phosphor(s), can be applied directly on or over the one or more LED chip 18, on, over, or within one or more surfaces of encapsulant 14 (e.g., an inner, outer, upper, or lower surface) for producing cool and/or warm white output. Optical conversion material (i.e., wavelength conversion material including phosphor) can be uniformly or non-uniformly dispersed within encapsulant 14 or can be omitted entirely from LED components 10. Optical conversion material can comprise one or more phosphors adapted to emit blue, yellow, red, and/or green light upon impingement with light from the one or more LED chip 18. In some embodiments, optical conversion material may be provided when encapsulant 14 is in liquid form and fixed therein as encapsulant 14 cures. In some embodiments, encapsulant 14 can be devoid of any optical conversion material.

Notably, LED components 10 can be devoid of a costly leadframe encased within molded plastic, and can rather utilize thin, electrically conductive traces 30 and 32, which can be customized with respect to size, placement, layout, and/or electrical configuration with respect to LED chips 18 and bottom contacts 40 and 42. Individual LED components 10 can each comprise an individual submount 16 over which LED chips 18 are provided, where each submount 16 is a portion of panel P, which is singulated from panel P during a singulation process (e.g., sawing, dicing, laser cutting, shearing, breaking, etc.). Submount 16 can comprise any size, shape, and/or cross-sectional shapes. For illustration purposes, a substantially square shape having a substantially rectangular cross-sectional shape is illustrated, however, any other non-square and non-rectangular shape(s) can be provided.

In some embodiments, submount 16 can be square and for example comprise a length and width of approximately 5 mm×5 mm, or a surface area of approximately 25 mm². As noted above however, any size and/or shape of submount 16 can be provided (e.g., where a length and/or width is approximately 10 mm or less, approximately 7 mm or less, approximately 5 mm or less, approximately 3 mm or less, etc.). Submount 16 can comprise any thickness, such as between approximately 0.35 and 2.0 mm thick. In some embodiments, submount 16 is approximately 0.6 mm, or 0.635 mm. Submount 16 can also be thicker than 0.5 mm or 1.0 mm (e.g., 2.0 mm, 3.0 mm, etc.) where desired.

Referring to FIG. 6, light transmission through encapsulant 14 and its effect on viewing angle is illustrated. As FIG. 6 illustrates, light L passes through encapsulant 14. Encapsulant 14 can be clear, transparent, or otherwise permeable to light. That is, LED components 10 do not comprise a dam structure. This advantageously increases a viewing angle of component 10, allowing it to be used within more lighting products, fixtures, and/or provide lighting designers and bulb manufacturers with more options. A single LED chip 18 or multiple LED chips 18 can be provided per LED component 10. When light L is allowed to pass through encapsulant 14 that extends entirely to each edge of and all outer edges of the submount 16 of LED component 10, a viewing angle increases (see, e.g., relative to FIG. 1) to a second, larger angle, indicative of omitting a dam, wall or structure. Larger viewing angles are suitable for light bulb applications, as bulbs typically emit multi- or omnidirectional light, both above and below a horizontal plane, or on either side of a vertical plane, where the component is vertically disposed within a bulb or fixture (e.g., FIGS. 17A-17E), or in other high power LED applications, including, for example, projection and architectural applications.

In some embodiments, this wider full width at half maximum (FWHM) beam angle of the dam-less LED component 10 is greater than 125°. An effective FWHM beam angle (e.g., an effective viewing angle) can be approximately 126° or more, approximately 128° or more, approximately 130° or more, and/or approximately 135° or more. Increasing the viewing angle here does not adversely affect color temperature, or other optical properties associated with LED component 10.

As FIG. 6 further illustrates, LED component 10 does not comprise a retention structure, instead only having a flat, non-domed layer of molded encapsulant 14. Individual LED components 10 can be built and batch processed over a ceramic panel (e.g., P, FIG. 2) prior to singulation therefrom. During singulation, the encapsulant 14 over adjacent components 10 can be cut into (e.g., bisected vertically), such that one dispensed dam becomes split between at least two adjacent components 10. Encapsulant 14, therefore, can form external walls of individual LED components 10. Encapsulant 14 can comprise substantially planar outer walls which are oriented to be in an at least substantially or entirely vertically oriented plane. During singulation, smooth encapsulant 14 can be formed. The cross-sectional shape of encapsulant 14 can be customized for producing resultant customized beam patterns and/or beam shapes. In some embodiments, the substantially vertically oriented (e.g., 90°±10°, ±5°, ±3°, and/or ±1°) walls of the encapsulant 14 are at least substantially or entirely co-planar with the corresponding vertically oriented walls of the submount 16.

Figure 7A:
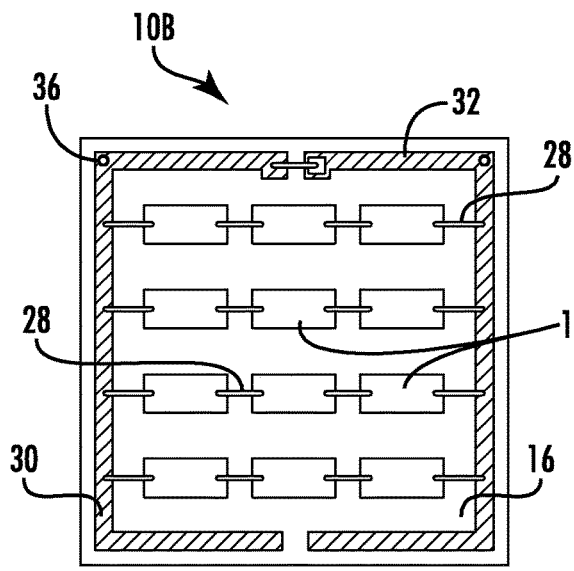
FIGS. 7A through 7C are top plan views of example embodiments of an LED component from the panel of FIG. 6, according to the disclosure herein.
Figure 7B:
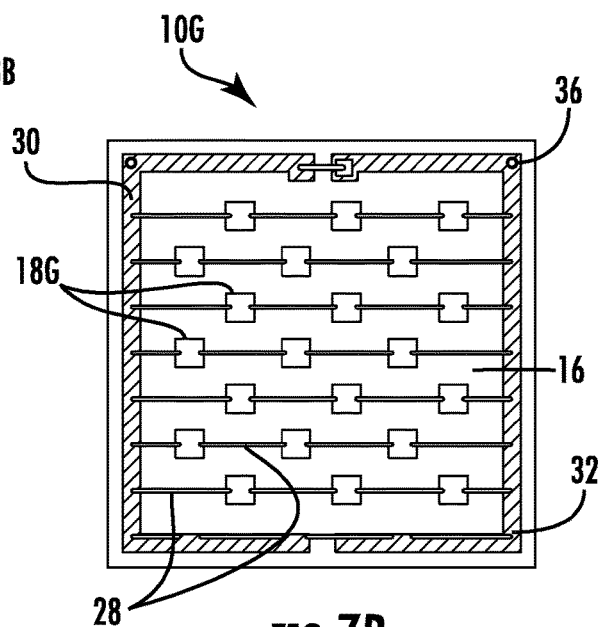
Figure 7C:
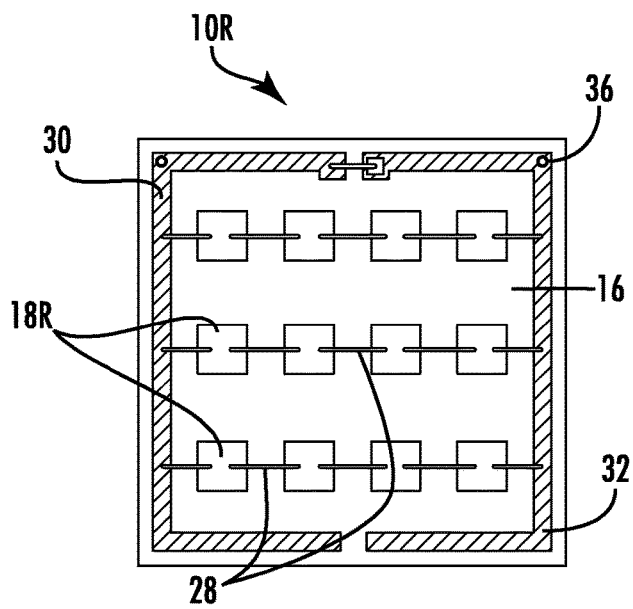

Referring to FIGS. 7A through 7C, example embodiments are illustrated that show single wavelength outputting LED components.

In FIG. 7A, a blue-light-emitting LED component, generally designated 10B, is shown. LED component 10B has a total of twelve blue-light-emitting LED chips 18B connected in four parallel strings of three LED chips 18B each, with each string of LED chips 18B being wirebonded to each other and between electrically conductive traces 30 and 32. One or more LED chip 18B may also be attached to submount by a direct attach technique. LED chips 18B have a rectangular light-emitting area shape, but any suitable shape may be used for LED chips 18B. Furthermore, any suitable number and connection of LED chips 18B may be used on submount 16 and connected between electrically conductive traces 30 and 32.

In FIG. 7B, a green-light-emitting LED component, generally designated 10G, is shown. LED component 10G has a total of twenty-one green-light-emitting LED chips 18G connected in seven parallel strings of three LED chips 18G each, with each string of LED chips 18G being wirebonded to each other and between electrically conductive traces 30 and 32. One or more LED chip 18G may also be attached to submount by a direct attach technique. LED chips 18G have a square light-emitting area shape, but any suitable shape may be used for LED chips 18G. Furthermore, any suitable number and connection of LED chips 18G may be used on submount 16 and connected between electrically conductive traces 30 and 32.

In FIG. 7C, a red-light-emitting LED component, generally designated 10R, is shown. LED component 10R has a total of twelve red-light-emitting LED chips 18R connected in three parallel strings of four LED chips 18R each, with each string of LED chips 18R being wirebonded to each other and between electrically conductive traces 30 and 32. One or more LED chip 18R may also be attached to submount by a direct attach technique. LED chips 18R have a rectangular light-emitting area shape, but any suitable shape may be used for LED chips 18R. Furthermore, any suitable number and connection of LED chips 18R may be used on submount 16 and connected between electrically conductive traces 30 and 32.

Each of the embodiments shown in FIGS. 7A through 7C have substantially the same (e.g., within 10%, within 5%, within 3%, or within 1%) total light-emitting area and are interconnected between electrically conductive traces 30 and 32 such that the effective voltage for each of the LED components 10B, 10G, and 10R are designed to be powered by substantially similar (e.g., within 10%, within 5%, within 3%, or within 1%) voltage sources, such as, for example, 9 Volts (V).

Figure 8A:
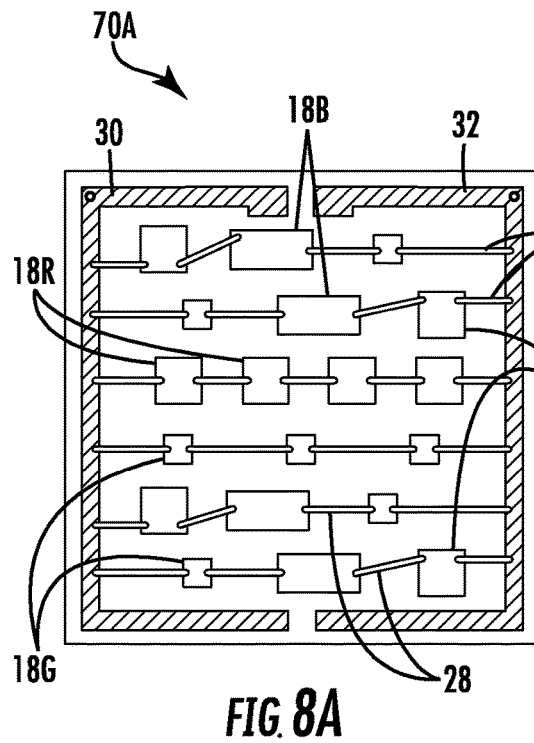
FIGS. 8A and 8B are top plan views of example embodiments of an LED component with red, green, blue, and white LED chips attached thereto, according to the disclosure herein.
Figure 8B:
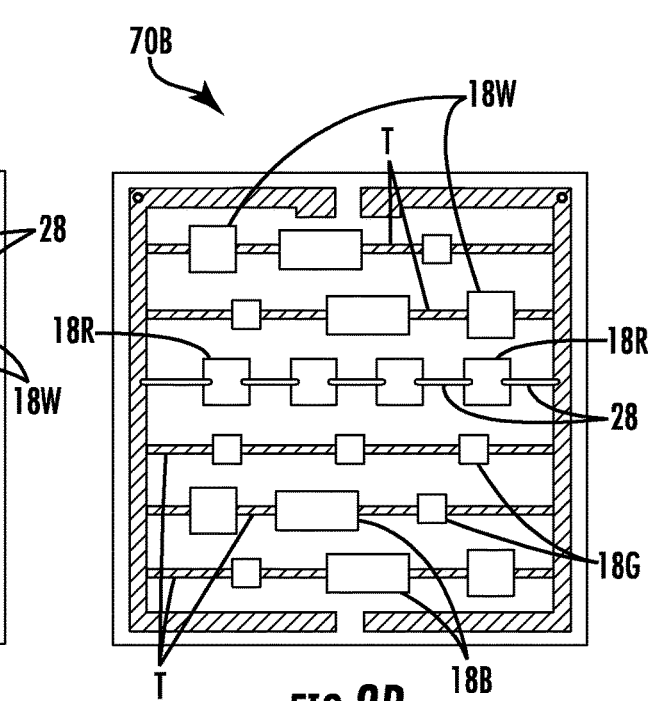

Referring to FIGS. 8A and 8B, two example embodiments of a single LED component, generally designated 70A and 70B, respectively, configured to generate red, green, blue, and white light from red LED chips 18R, green LED chips 18G, blue LED chips 18B, and white LED chips 18W, respectively. In some embodiments, the white LED chip(s) 18W are LEDs that are coated with one or more luminophoric medium. In the embodiment of FIG. 8A, the LED chips 18R, 18G, 18B, and 18W are wirebonded in intermixed strings of LED chips 18R, 18G, 18B, and 18W between electrically conductive traces 30 and 32. In the embodiment of FIG. 8B, the LED chips 18R, 18G, 18B, and 18W are directly attached by traces T in intermixed strings of LED chips between electrically conductive traces 30 and 32, while the red LED chips 18R are wirebonded to each other in a string of four red LED chips 18R between the electrically conductive traces 30 and 32. Any combination of direct attach and wirebonding techniques may be used in a single LED component 70A and/or 70B. In both FIGS. 8A and 8B, LED components 70A and 70B have six strings of LED chips, each string having three or four LED chips, so that a total light-emitting area is substantially the same (e.g., within 10%, within 5%, within 3%, or within 1%) between the red LED chips 18R, green LED chips 18G, blue LED chips 18B, and white LED chips 18W, so that a common voltage source may be used to energize the plurality of different LED chips. In these embodiments, there are four red LED chips 18R, seven green LED chips 18G, four blue LED chips 18B, and four white LED chips 18W such that the total light-emitting area for each color LED chip is between approximately 1.44 square millimeters (mm$^2$) and 1.49 mm$^2$.

Figure 9A:
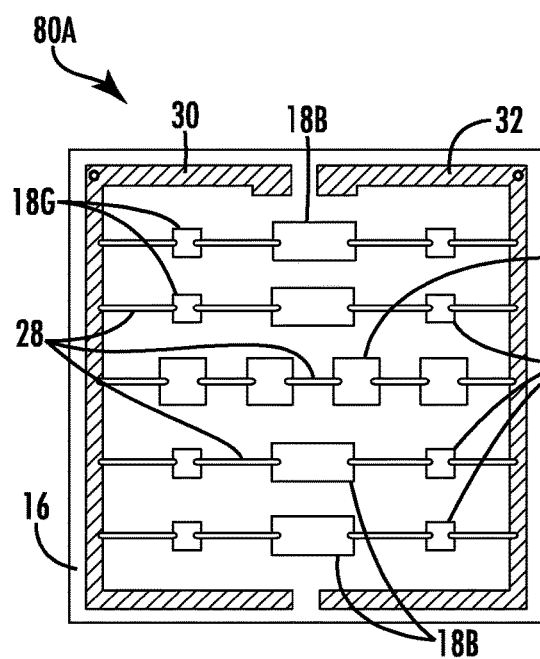
FIGS. 9A and 9B are top plan views of example embodiments of an LED component with red, green, and blue LED chips attached thereto, according to the disclosure herein.
Figure 9B:
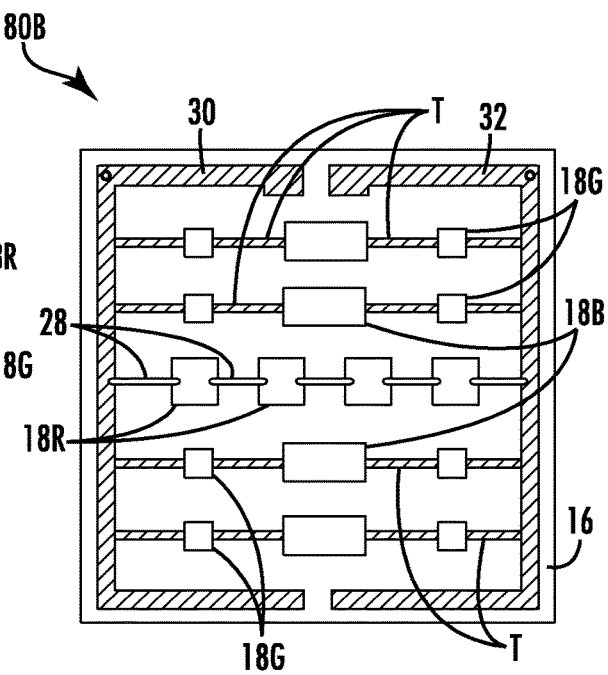

Referring to FIGS. 9A and 9B, two example embodiments of a single LED component, generally designated 80A and 80B, respectively, configured to generate red, green, and blue light from red LED chips 18R, green LED chips 18G, and blue LED chips 18B, respectively. In the embodiment of FIG. 9A, the LED chips 18R, 18G, and 18B are wirebonded in intermixed strings of LED chips 18R, 18G, and 18B between electrically conductive traces 30 and 32. In the embodiment of FIG. 9B, the LED chips 18R, 18G, and 18B are directly attached by traces in intermixed strings of LED chips between electrically conductive traces 30 and 32, while the red LED chips 18R are wirebonded to each other in a string of four red LED chips 18R between the electrically conductive traces 30 and 32. Any combination of direct attach and wirebonding techniques may be used in a single LED component 80A and/or 80B. In both FIGS. 9A and 9B, LED components 80A and 80B have six strings of LED chips, each string having three or four LED chips, so that a total light-emitting area is substantially the same (e.g., within 10%, within 5%, within 3%, or within 1%) between the red LED chips 18R, green LED chips 18G, and blue LED chips 18B, so that a common voltage source may be used to energize the plurality of different LED chips. In these embodiments, there are four red LED chips 18R, eight green LED chips 18G, and four blue LED chips 18B, such that the total light-emitting area for each color LED chip is between approximately 1.49 mm$^2$ and 1.67 mm$^2$.

In the embodiments shown in FIGS. 8A to 9B, the red LED chips 18R have a length of approximately 0.61 mm and a width of approximately 0.61 mm; the green LED chips 18G have a length of approximately 0.46 mm and a width of approximately 0.46 mm; the blue LED chips 18B have a length of approximately 0.43 mm and a width of approximately 0.86 mm; and the white LED chips 18W have a length of approximately 0.6 mm and a width of approximately 0.6 mm. In this embodiment, the red LED chips 18R output a light wavelength between 600-750 nm at an input voltage of 2.2 V; the green LED chips 18G output a light wavelength between 490-570 nm with a reference voltage of 3.0 V; the blue LED chips 18B output a light wavelength between 400-490 nm with a reference voltage of 3.0 V; and the white LED chips 18W output a white light with a reference voltage of 3.0 V.

Figure 10:
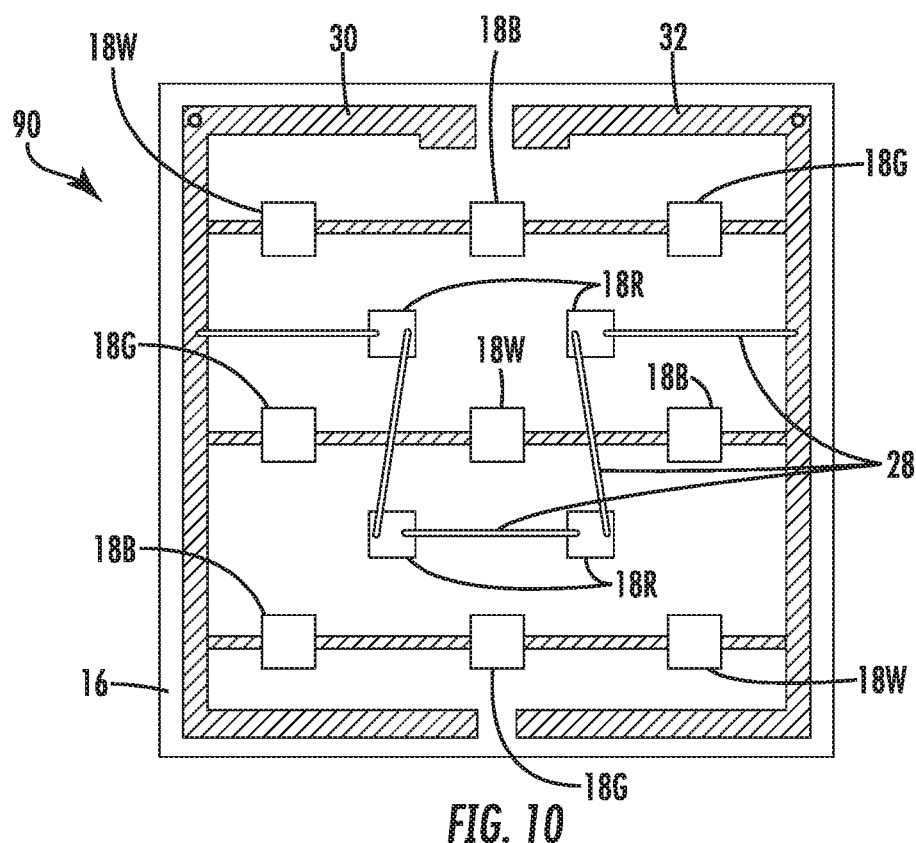
FIG. 10 is a top plan view of an example embodiment of an LED component with red, green, blue, and white LED chips attached thereto, according to the disclosure herein.

Referring to FIG. 10, a further example embodiment of a single LED component, generally designated 90, configured to generate red, green, blue, and white light from red LED chips 18R, green LED chips 18G, blue LED chips 18B, and white LED chips 18W, respectively. In the embodiment of FIG. 10, the LED chips 18R, 18G, 18B, and 18W are connected to each other and between the electrically conductive traces 30 and 32 in intermixed strings of LED chips 18R, 18G, 18B, and 18W. Any combination of direct attach and wirebonding techniques may be used in a single LED component 90. In FIG. 10, LED component 90 has four strings of LED chips, each string having three or four LED chips, so that a total light-emitting area is substantially the same (e.g., within 10%, within 5%, within 3%, or within 1%) between the red LED chips 18R, green LED chips 18G, blue LED chips 18B, and white LED chips 18W, so that a common voltage source may be used to energize the plurality of different LED chips. In this embodiment, there are four red LED chips 18R, three green LED chips 18G, three blue LED chips 18B, and three white LED chips 18W such that the total light-emitting area for each LED chip is between approximately 1.47 square millimeters (mm$^2$) and 1.49 mm$^2$.

Figure 11:
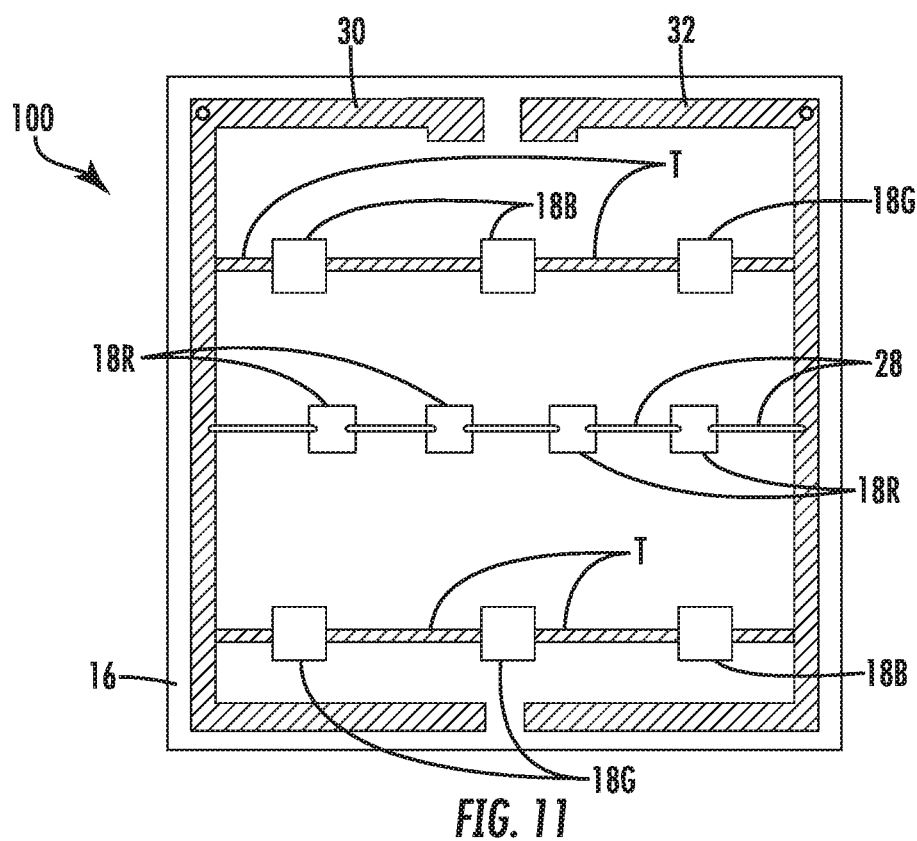
FIG. 11 is a top plan view of an example embodiment of an LED component with red, green, and blue LED chips attached thereto, according to the disclosure herein.

Referring to FIG. 11, a further example embodiment of a single LED component, generally designated 100, configured to generate red, green, and blue light from red LED chips 18R, green LED chips 18G, and blue LED chips 18B, respectively. In the embodiment of FIG. 11, the LED chips 18R, 18G, and 18B are connected to each other and between the electrically conductive traces 30 and 32 in intermixed strings of LED chips 18R, 18G, and 18B. Any combination of direct attach and wirebonding techniques may be used in a single LED component 100. In FIG. 11, LED component 100 has three strings of LED chips, each string having three or four LED chips, so that a 10 total light-emitting area is substantially the same (e.g., within 10%, within 5%, within 3%, or within 1%) between the red LED chips 18R, green LED chips 18G, and blue LED chips 18B, so that a common voltage source may be used to energize the plurality of different LED chips. In this embodiment, there are four red LED chips 18R, three green LED chips 18G, and three blue LED chips 15 18B, such that the total light-emitting area for each LED chip is between approximately 1.47 square millimeters (mm$^2$) and 1.49 mm$^2$.

In the embodiments shown in FIGS. 10 and 11, all of the LED chips have a square light-emitting area, with the red LED chips 18R having a length of approximately 0.61 mm and a width of approximately 0.61 mm and each of the green LED chips 18G, the blue LED chips 18B, and the white LED chips 18W having a length of approximately 0.7 mm and a width of approximately 0.7 mm.

In the embodiments illustrated in FIGS. 8A to 11, a mixture of colors can be generated form a plurality of LED components or from just a single LED component. Additionally, in some embodiments, a single wavelength of light output can be generated by providing only a single type of LED chip or by controlling an activation of a single type of LED chip from a plurality of LED chips provided in a system of LED components or on a single substrate.

Figure 12:
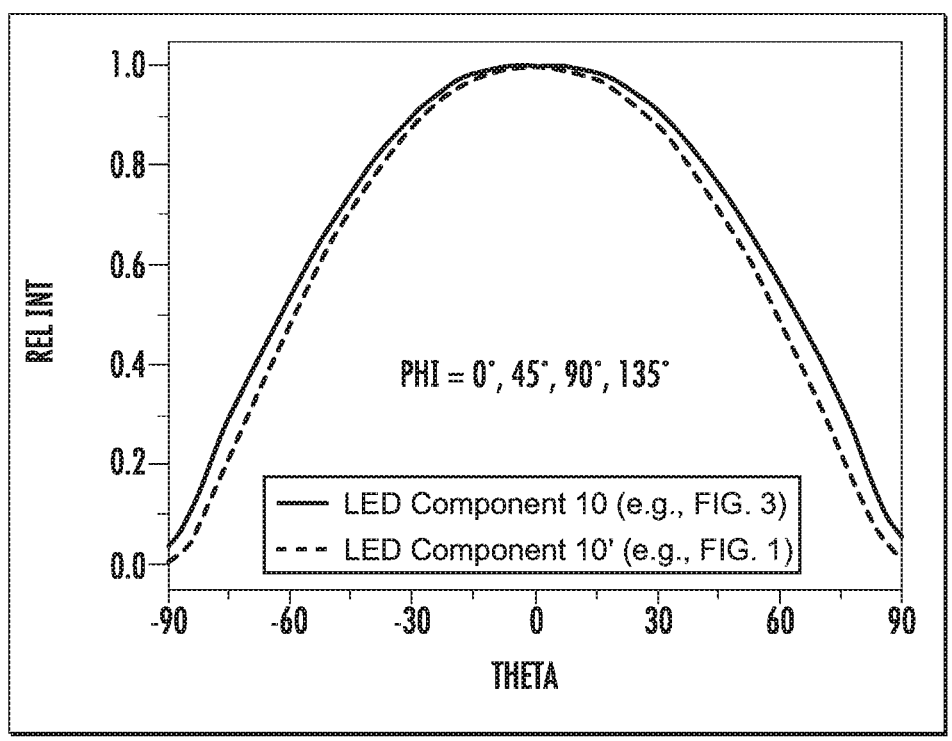
FIG. 12 is an example graphical plot demonstrating an improvement of the viewing angle (theta) against the relative luminous intensity produced for the LED component of FIG. 3 over a prior art LED component such as is illustrated in FIG. 1, according to the disclosure herein.

Referring to FIG. 12, an example graphical plot shows the relationship between the viewing angle (theta) and the relative luminous intensity of LED component 10 relative to LED component 10'. Unlike in LED components that have an encapsulant that is dispensed within a dam or other retention structure (see, e.g., FIG. 1), it can be seen that the relative luminous intensity does not decrease to zero, even when the viewing angle is at +90° or −90° (e.g., in the same plane as the width or length of the LED component).

Figure 13:
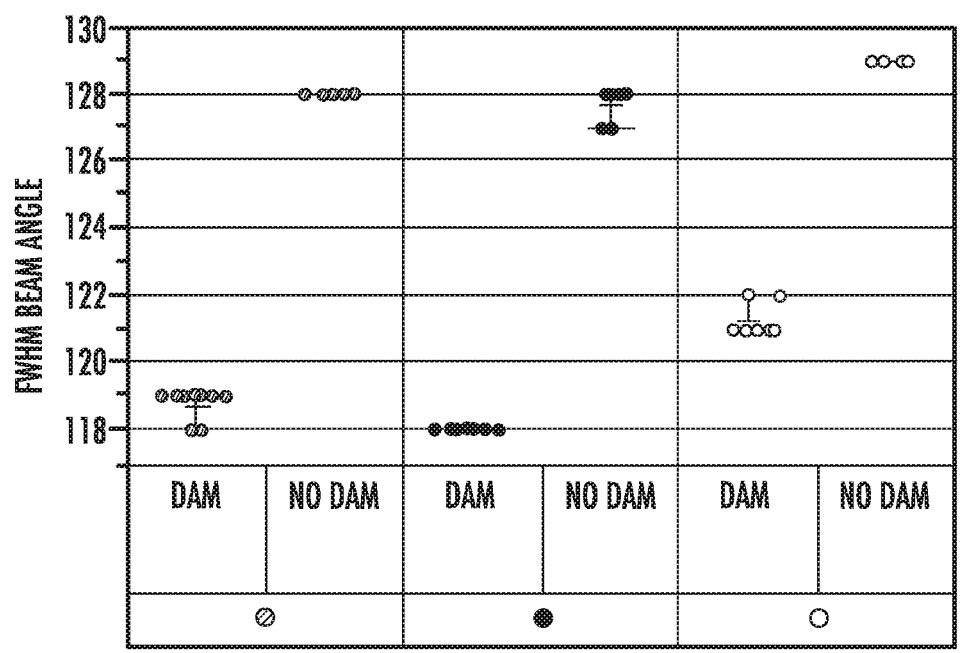
FIG. 13 is a graphical plot showing a difference in FWHM beam angle between LED components that do not have retention structures compared to LED components that have such retention structures, according to the disclosure herein.

Referring to FIG. 13, a graphical representation of full width at half maximum (FWHM) beam angle is plotted for an LED component 10' (see FIG. 1) with a "dam" or retention structure and an LED component 10 (see FIG. 3) with "no dam" or retention structure. In the left column, a plot for an example blue-light-emitting LED component 10B (FIG. 7A) is shown. In the center column, a plot for an example green-light-emitting LED component 10G (FIG. 7B) is shown. In the right column, a plot for an example red-light-emitting LED component 10R (FIG. 7C) is shown. Regardless of the color of light output, these graphical plots demonstrate that an increase in FWHM beam angle of between 7° and 10° is attainable by providing a molded encapsulant (14, FIG. 3) that extends over an entire upper surface of an LED component (e.g., 10B, 10G, or 10R; FIGS. 7A-C), with such encapsulant 14 extending entirely to the outer lateral edges of the submount (16, FIG. 3) so as to be co-planar with each of the corresponding outer edges of the submount.

Figure 14A:
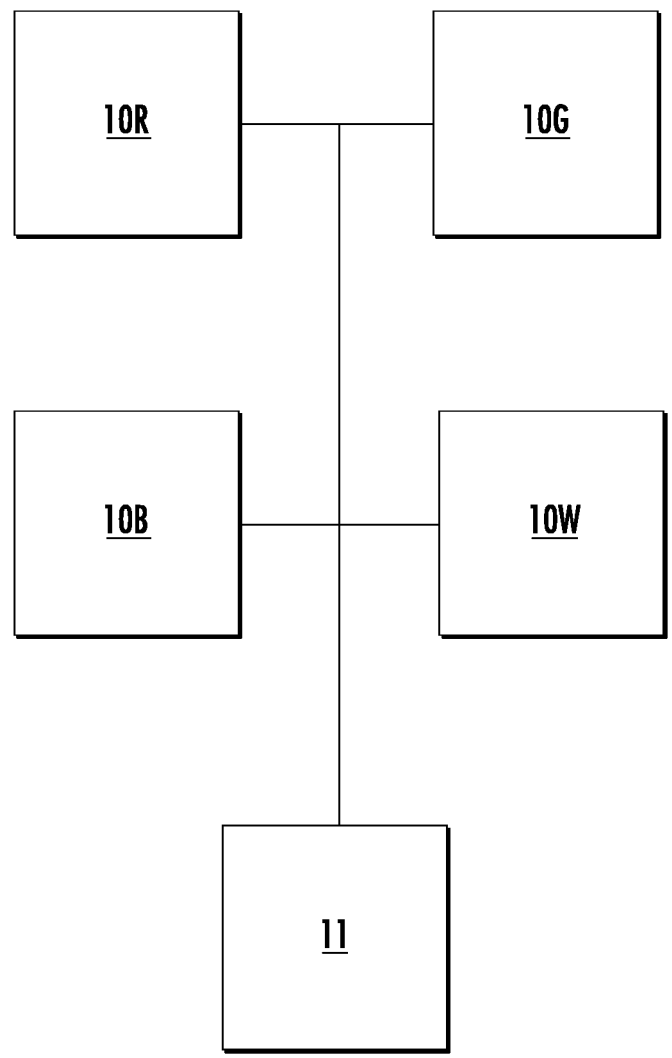
FIGS. 14A and 14B are schematic diagrams of a system according to the disclosure herein.
Figure 14B:
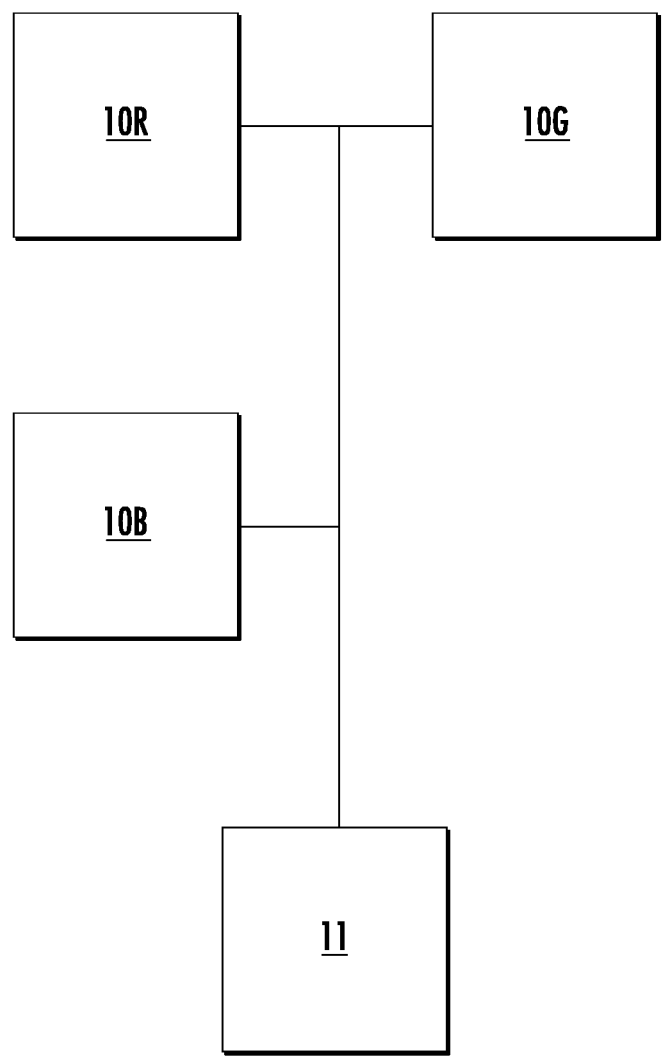

Referring to FIG. 14A, a red-light-emitting LED component 10R, a green-light-emitting LED component 10G, a blue-light-emitting LED component 10B, and a white-light-emitting LED component 10W are interconnected with each other and are controlled by a controller 11 to produce a tunable light output. In FIG. 14B, a red-light-emitting LED component 10R, a green-light-emitting LED component 10G, and a blue-light-emitting LED component 10B are interconnected with each other and are controlled by a controller 11 to produce a tunable light output. In some embodiments, such as those shown in FIGS. 14A and 14B, the red-light-emitting LED component 10R, the green-light-emitting LED component 10G, the blue-light-emitting LED component 10B, and/or the white-light-emitting LED component 10W can be independently controlled by controller 11 to output a sum of the wavelengths that is customizable over a wide range of output wavelengths. As such, in the embodiments shown in FIGS. 14A and 14B, each of the LED components are controlled on a single electrical circuit.

Figure 15:
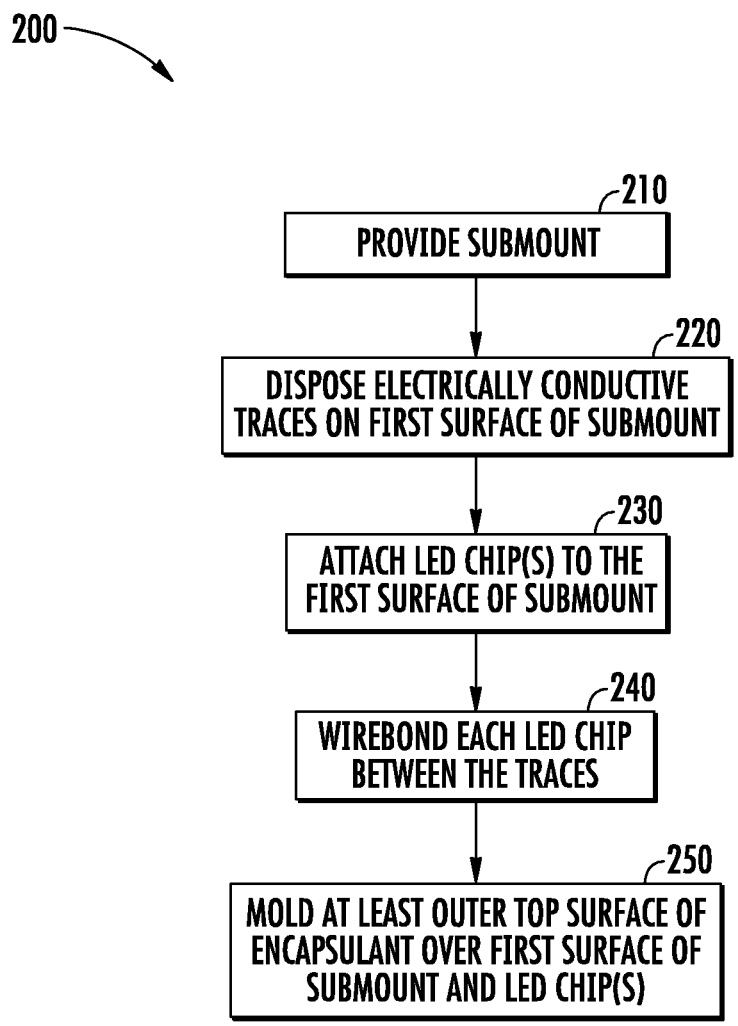
FIGS. 15 and 16 are flow charts for respective example embodiments of methods of providing LED component(s), according to the disclosure herein.

Referring to FIG. 15, a flow chart for an example method, generally designated 200, of providing an LED component (e.g., 10, FIG. 3) is shown. The method can comprise providing a substantially flat submount 210; disposing first and second electrically conductive traces on a first surface of the submount on opposite sides from each other and disposed at least proximate to or at outer edges of the submount 220; attaching one or more LED chip over the first surface of the submount 230; electrically connecting, via wirebonding, each of the one or more LED chip between the first and second electrically conductive traces 240; and molding at least or only an outer top surface of an encapsulant over the first surface of the submount and over the one or more LED chip so that the outer top surface of the encapsulant is substantially flat, wherein the encapsulant comprises at least one lateral exterior wall that extends entirely to one of the outer edges of the submount 250. The resulting LED components produced from the method 200 have, for example, a full width at half maximum (FWHM) beam angle that is greater than 125°, and the LED components are devoid of a retention wall (e.g., retention structure 12, FIG. 1) laterally surrounding the encapsulant. In some embodiments, the method can comprise providing a plurality of substantially flat submounts. In some other embodiments, the encapsulant can be co-planar with a lateral exterior wall of the submount. In some embodiments, the one or more LED chip comprises a plurality of LED chips and the method comprises arranging the plurality of LED chips into a plurality of linear strings of LED chips, with each of the plurality of linear strings of LED chips being electrically connected between the first and second electrically conductive traces. In still other embodiments, all lateral exterior walls of the encapsulant extend entirely to a corresponding outer edge of the submount to be co-planar with a corresponding lateral exterior wall of the submount. In some embodiments, the FWHM beam angle of the LED component is approximately 128° or more, or approximately 130° or more. In some other embodiments, the one or more LED chip comprises a plurality of red LED chips, a plurality of green LED chips, or a plurality of blue LED chips. In yet other embodiments, the one or more LED chip comprises a plurality of red LED chips, a plurality of green LED chips, and a plurality of blue LED chips. In some such embodiments, the plurality of red LED chips, the plurality of green LED chips, and the plurality of blue LED chips each have a substantially similar or identical total light-emitting area. In other such embodiments, the one or more LED chip comprises at least one white LED chip.

Figure 16:
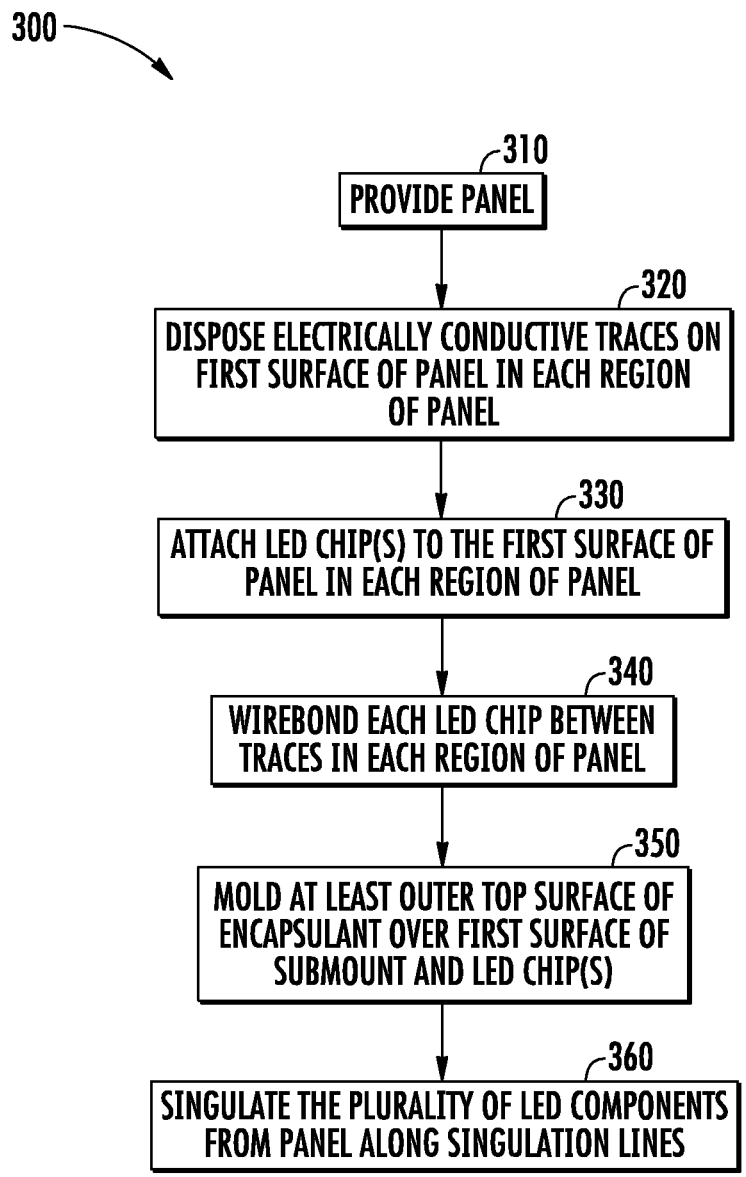

Referring to FIG. 16, a flow chart for an example method, generally designated 300, of providing a plurality of LED components (e.g., 10, FIG. 3) from a panel (e.g., P, FIG. 2) is shown. The method comprises providing a substantially flat panel 310; disposing, in each of a plurality of regions of the panel, first and second electrically conductive traces on a first surface of the panel on opposite sides from each other and disposed at least proximate to or at outer edges of the region 320; attaching, in each of the plurality of regions of the panel, one or more LED chip over the first surface of the panel 330; electrically connecting, in each of the plurality of regions of the panel, each of the one or more LED chip via wirebonding between the first and second electrically conductive traces 340; molding at least or only an outer top surface of an encapsulant over the first surface of the panel and over the one or more LED chip in each region so that the outer top surface of the encapsulant is substantially flat, wherein the encapsulant comprises at least one lateral exterior wall that extends entirely to one of the outer edges of the submount 350; and singulating the plurality of LED components from the panel along singulation lines corresponding to edges of each region to create the plurality of LED components 360. In such embodiments, each of the plurality of regions corresponds to a size of a submount for one of the plurality of LED components, each LED component has a full width at half maximum (FWHM) beam angle that is greater than 125°, and each LED component is devoid of a retention wall laterally surrounding the encapsulant. In some embodiments, the encapsulant for each of the plurality of LED components is co-planar with a lateral exterior wall of the submount after singulation. In some embodiments, the one or more LED chip in one or more of the plurality of LED components comprise a plurality of LED chips, the method comprising arranging the plurality of LED chips into a plurality of linear strings of LED chips, wherein each of the plurality of linear strings of LED chips are electrically connected between the first and second electrically conductive traces. In some embodiments, all lateral exterior walls of the encapsulant for each of the plurality of LED components extend entirely to a corresponding outer edge of the submount to be co-planar with a corresponding lateral exterior wall of the submount. In some embodiments, the FWHM beam angle of each of the plurality of LED components is approximately 128° or more, or approximately 130° or more. In some embodiments, the one or more LED chip of one or more of the plurality of LED components comprise a plurality of red LED chips, a plurality of green LED chips, or a plurality of blue LED chips. In yet other embodiments, the one or more LED chip of one or more of the plurality of LED components comprise a plurality of red LED chips, a plurality of green LED chips, and a plurality of blue LED chips. In some embodiments, the plurality of red LED chips, the plurality of green LED chips, and the plurality of blue LED chips for one or more of the plurality of LED components each have a substantially similar or identical total light-emitting area. In other embodiments, the one or more LED chip of one or more of the plurality of LED components comprise at least one white LED chip.

Embodiments described herein have particular utility with respect to various form factor light fixtures. For example, each of the embodiments disclosed herein may be alternatively implemented in various types of solid state light fixtures including, for example, downlights, troffers, streetlights, canopy lights, parking garage lights, lights that use waveguide technology and other lighting fixtures, example embodiments of which are shown and discussed relative to FIGS. 17A through 17E.

Figure 17A:
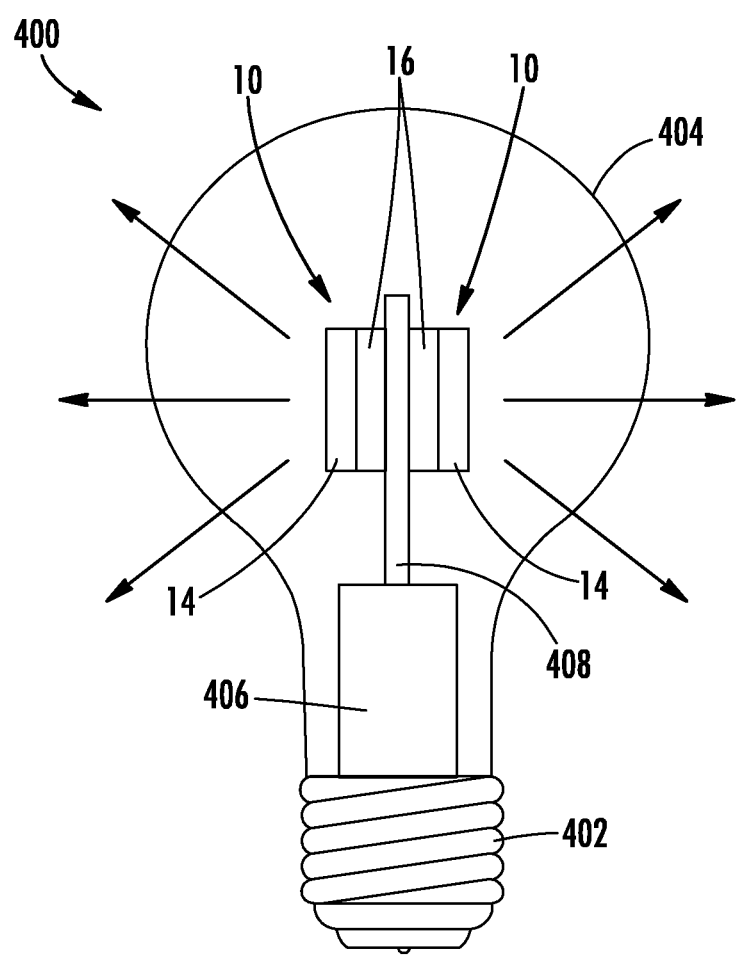
FIGS. 17A through 17E are example embodiments of a lighting bulb, lighting fixtures, and lighting applications incorporating one or more LED components according to the disclosure herein.

FIG. 17A is a lighting fixture, product, or bulb, generally designated 400. While bulb 400 illustrates an omnidirectional light bulb (e.g., an A19 bulb), other similar consumer lights, such as PAR, BR and candelabra bulbs, can also implement the embodiments described herein. Example lights of the type shown in FIG. 17A are described in U.S. Pat. Nos. 8,591,062 and 8,596,819 and U.S. patent application Ser. No. 14/306,342, each of which are incorporated herein by reference. Bulb 400 can incorporate at least one component 10 therein. In some embodiments, multiple components 10 are vertically disposed within a single lighting fixture or bulb 400. Bulb 400 can comprise a cap or base 402 configured to engage an electrical socket for powering and illuminating the bulb. LED components 10 can be housed or encased within an enclosure 404, which can comprise glass and/or plastic. Components 10 can be elevated within enclosure 404 via a pedestal 406 or body, which can comprise a mounting portion 408. Multiple components 10 can be attached and/or mounted to mounting portion 408. Multiple components 10 can be positioned about a plurality of surfaces or sides of mounting portion 408 for emitting light from different angles and/or sides of enclosure 404.

Bulb 400 can deliver at least 50 LPW or more, at least 100 LPW or more, at least 110 LPW or more, or more than 150 LPW. In some embodiments, lighting fixture is configured to emit white light having a reference point on the blackbody locus (e.g., 1931 CIE Chromaticity Diagram) having a color temperature of less than or approximately equal to 5000 K, less than or approximately equal to 4000 K, less than or approximately equal to 3500 K, less than or approximately equal to 3000 K, or less than or approximately equal to 2700 K. In some embodiments, combined emissions from bulb 400 embody a color rendering index (CRI Ra) value of at least 70, at least 75, at least 80 (e.g., 82 or 85), or at least 90 or more. Bulb 400 can also be dimmable, where desired.

Notably, the light intensity distribution of bulb 400 can comprise any light intensity distribution, and in one embodiment comprises the desired light intensity distribution conforms to the ENERGY STAR® Partnership Agreement Requirements for Luminous Intensity Distribution, which is incorporated herein by reference, in the entirety. For an omnidirectional lamp, the Luminous Intensity Distribution is defined as "an even distribution of luminous intensity (candelas) within the 0° to 135° zone (vertically axially symmetrical). Luminous intensity at any angle within this zone shall not differ from the mean luminous intensity for the entire 0° to 135° zone by more than 20%. At least 5% of total flux (lumens) must be emitted in the 135°-180° zone. Distribution shall be vertically symmetrical as measures in three vertical planes at 0°, 45°, and 90°."

In some embodiments, the free end of enclosure 404, opposite to the base 402, is considered 0° and the base 402 of the bulb is considered 180°. As defined in the standard, luminous intensity is measured from 0° to 135° where the measurements are repeated in vertical planes at 0°, 45° and 90°. The structure and operation of bulb 400 of the instant disclosure is compliant with the ENERGY STAR® standard set forth above in some embodiments; however, and in other embodiments, bulb 400 can also be used to create other light intensity distribution patterns.

Figure 17B:
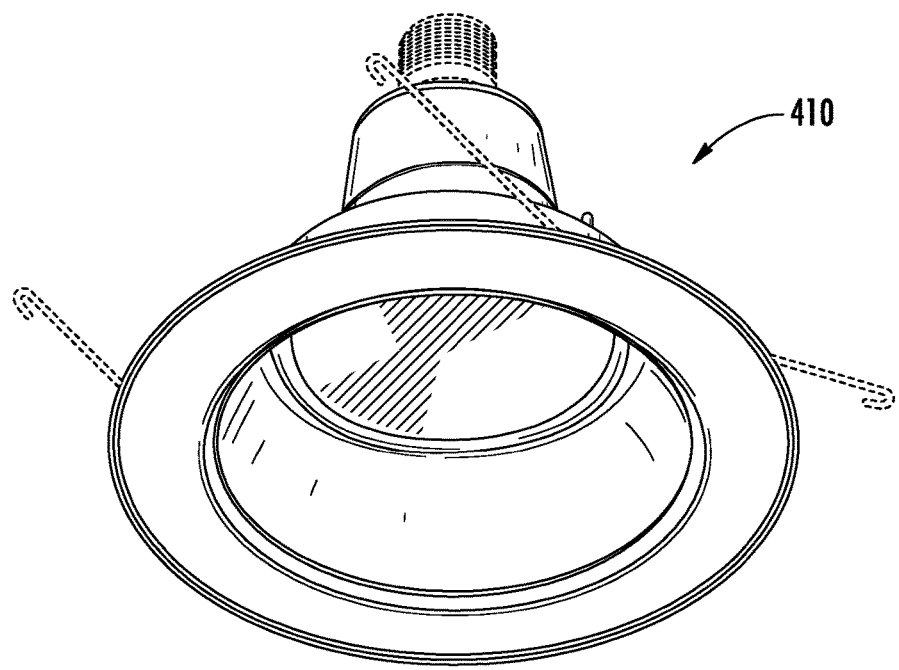
Figure 17C:
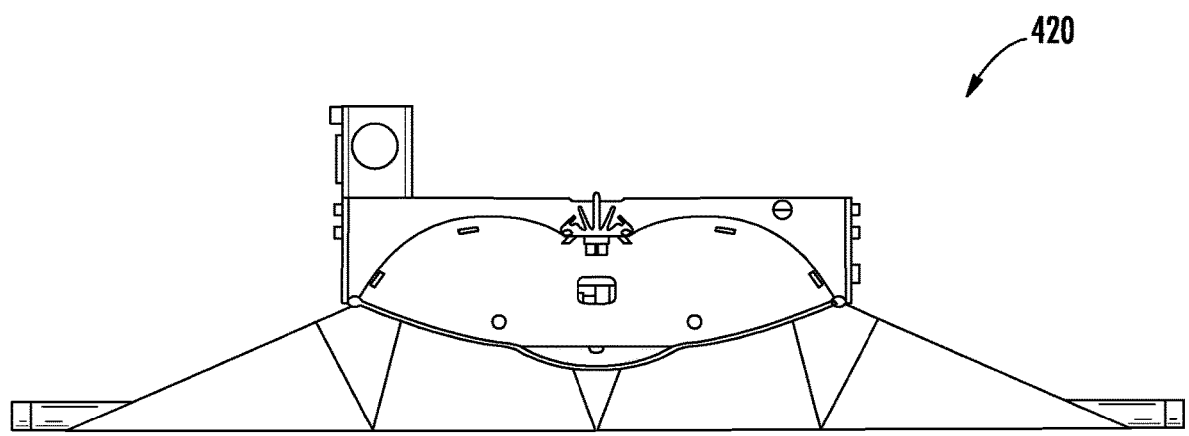
Figure 17D:
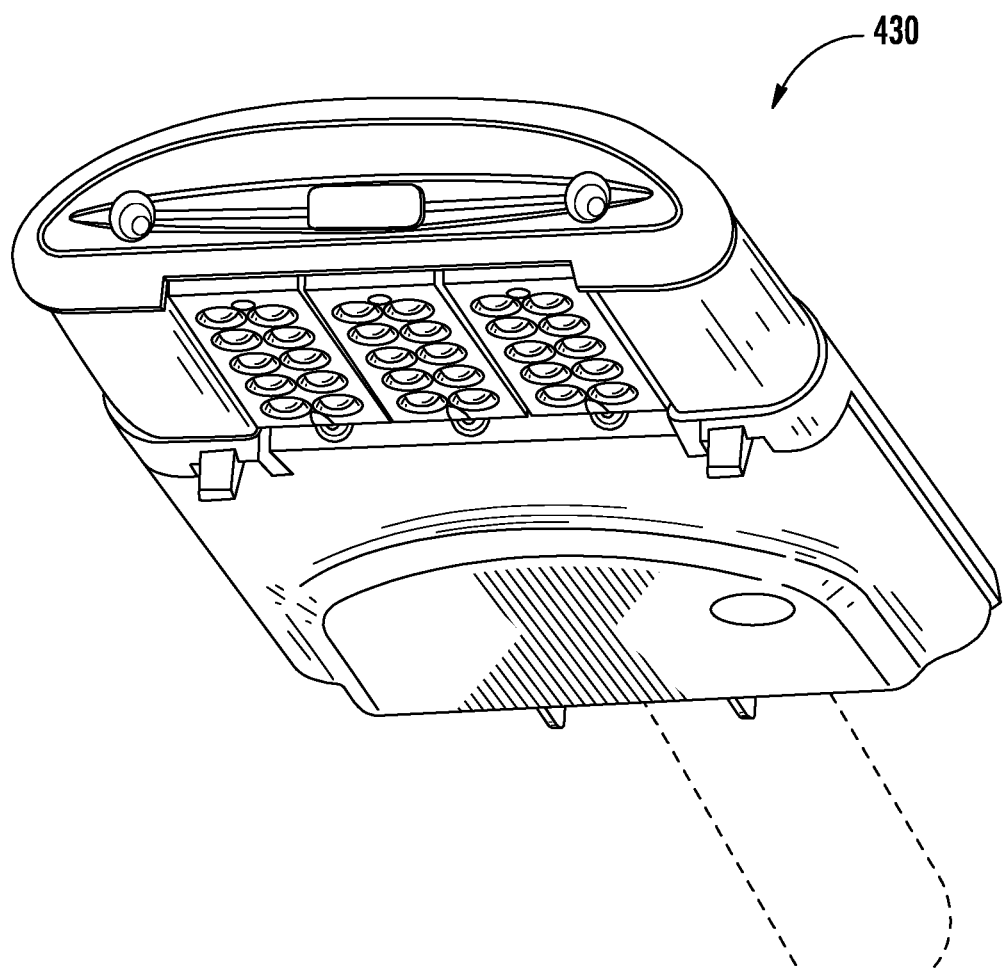
Figure 17E:
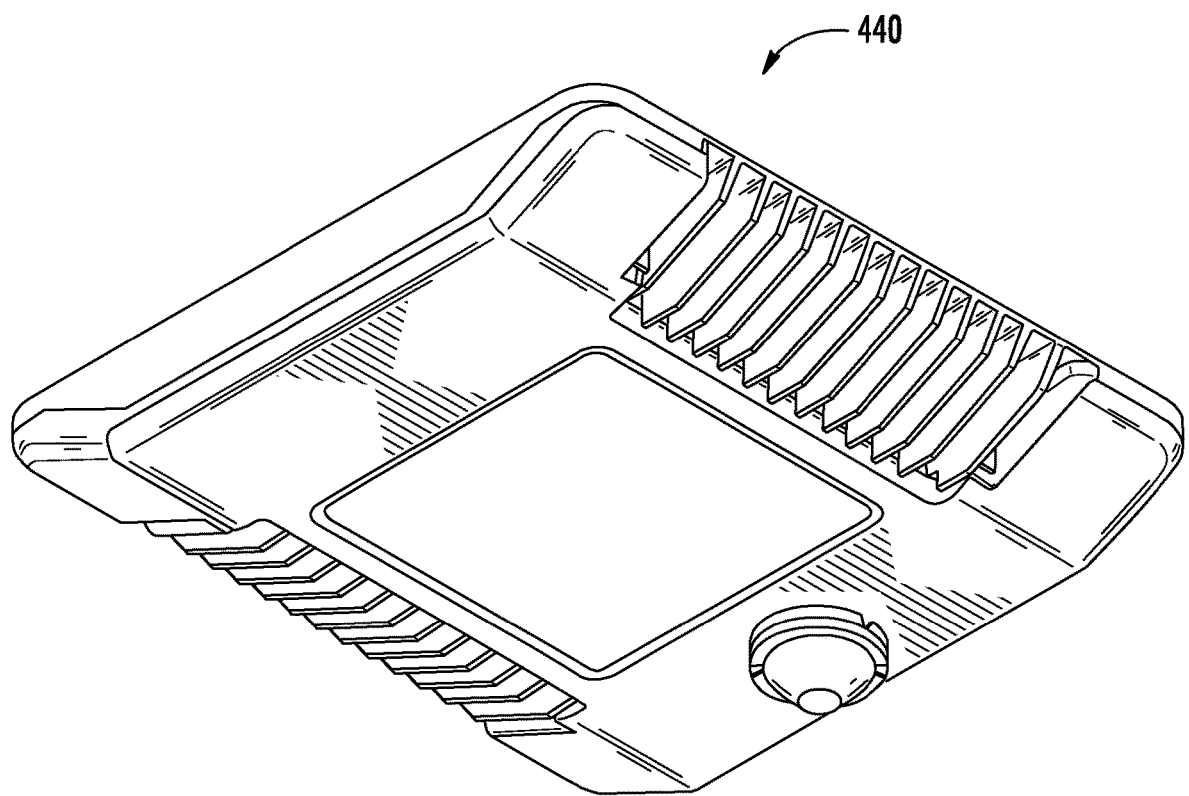

FIG. 17B shows a downlight, generally designated 410, that can incorporate the embodiments described herein. An example of such a down light is disclosed in U.S. Pat. No. 8,777,449 incorporated herein by reference. FIG. 17C illustrates a troffer light fixture, generally designated 420, that can incorporate the embodiments described herein. An example troffer light fixture is disclosed in U.S. Pat. Pub. No. 2012/0327650, incorporated by reference herein. In another example embodiment, FIG. 17D illustrates a solid state streetlight, generally designated 430, according to further embodiments of the present invention. The streetlight may be implemented according to any of the above-described embodiments of the present invention. Other streetlights and outdoor lighting fixtures that can be implemented using the above-described embodiments of the present invention include the lights disclosed in U.S. Pat. Nos. 8,622,584; 8,425,071; 9,028,087; and U.S. Pat. Pub. No. 2015/0253488, each of which is incorporated by reference herein. FIG. 17E illustrates a canopy light, generally designated 440, according to some embodiments of the present invention. An example canopy light incorporating the embodiments described herein is described in U.S. Pat. No. 9,182,096, incorporated by reference herein. Embodiments of the present invention may also be implemented in various other lighting fixtures, such as, for example, in the waveguide-based troffers disclosed in U.S. Pat. Pub. No. 2014/0347885, in the troffer style fixtures disclosed in U.S. Pat. Pub. No. 2012/0051041 and/or in the waveguide based garage lights disclosed in U.S. Pat. Pub. No. 2014/0355302, each of which is incorporated by reference herein. Other and similar light fixtures can be implemented for example using the circuitry described above.

Components described herein can be easily produced as the time consuming process and additional cost associated providing customized packages or components (e.g., customized pressed or molded plastic bodies, cavities, and/or individually molded optical elements) becomes obsolete. A multitude of different customized components, having customized colors, brightness, voltage, power, layout, sizes, and/or viewing angles can be provided without the expense of creating custom fabricated components and/or leadframe components.

Embodiments as disclosed herein may, for example and without limitation, provide one or more of the following beneficial technical effects: reduced cost of providing light emitter components; reduced processing time; increased viewing angle; improved light extraction; more uniform light extraction; improved manufacturability of light emitter components; improved ability to vary component features, such as trace design, number of LED chips, and retention structure layout.

While the components and methods have been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein. Various combinations and sub-combinations of the structures and features described herein are contemplated and will be apparent to a skilled person having knowledge of this disclosure. Any of the various features and elements as disclosed herein may be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A light emitting diode (LED) component, comprising:
    a submount;
    first and second electrically conductive traces located on opposite sides of a first surface of the submount from each other and disposed at least proximate to, or at outer edges of, the submount, wherein the first and second electrically conductive traces occupy a majority of the opposite sides on which the first and second electrically conductive traces are respectively located;
    a plurality of LED chips disposed on the first surface of the submount and spaced apart from the first and second electrically conductive traces, the plurality of LED chips comprising one or more red LED chips of a first size, one or more green LED chips of a second size, and one or more blue LED chips of a third size, at least one of the first size, the second size, and the third size being a different size;
    a plurality of wirebonds electrically connecting the plurality of LED chips between the first and second electrically conductive traces; and
    an encapsulant disposed on the first surface of the submount around the plurality of LED chips, the encapsulant having at least an outer top surface that is molded so that the outer top surface is substantially flat;
    wherein the LED component has a full width at half maximum (FWHM) beam angle that is greater than 125°,
    wherein the one or more red LED chips collectively comprise a first total light-emitting area, wherein the one or more green LED chips collectively comprise a second total light-emitting area, and wherein the one or more blue LED chips collectively comprise a third total light-emitting area, each of the first, second, and third total light-emitting areas being substantially similar total light-emitting areas,
    wherein the encapsulant comprises lateral exterior walls that each extend to an outer edge of the submount, and
    wherein the LED component is devoid of a retention wall laterally surrounding the encapsulant.

2. The LED component of claim 1, wherein the submount and the encapsulant are a square shape.

3. The LED component of claim 1, wherein all electrical connections between the plurality of LED chips and between the plurality of LED chips and the first and second electrically conductive traces comprise one of a plurality of wirebonds.

4. The LED component of claim 1, wherein all lateral exterior walls of the encapsulant extend entirely to a corresponding outer edge of the submount to be co-planar with a corresponding lateral exterior wall of the submount.

5. The LED component of claim 1, wherein the plurality of LED chips are arranged as a plurality of strings of LED chips, wherein each of the plurality of strings of LED chips is wirebonded between the first and second electrically conductive traces.

6. The LED component of claim 1, wherein the one or more red LED chips comprises a plurality of red LED chips.

7. The LED component of claim 1, wherein the one or more green LED chips comprises a plurality of green LED chips.

8. The LED component of claim 1, wherein the one or more blue LED chips comprises a plurality of blue LED chips.

9. The LED component of claim 1, wherein the plurality of LED chips comprises at least one white LED chip.

10. The LED component of claim 9, wherein the at least one white LED chip has a fourth total light-emitting area that is a substantially similar total light-emitting area to the first, second, and third total light-emitting areas.

11. The LED component of claim 1, wherein the LED component is devoid of a curved lens or hemispherical dome.

12. The LED component of claim 1, wherein the encapsulant extends entirely to all outer edges of the submount.

13. The LED component of claim 1, wherein the encapsulant is co-planar with a lateral exterior wall of the submount.

14. A light bulb or a light fixture comprising at least one LED component of claim 1.

15. A method of providing a light emitting diode (LED) component, the method comprising:
    providing a substantially flat submount;
    disposing first and second electrically conductive traces on opposite sides of a first surface of the submount from each other and disposed at least proximate to, or at outer edges of, the submount, wherein the first and second electrically conductive traces occupy a majority of the opposite sides on which the first and second electrically conductive traces are respectively located;
    attaching a plurality of LED chips over the first surface of the submount, the plurality of LED chips being spaced apart from the first and second electrically conductive traces and comprising one or more red LED chips of a first size, one or more green LED chips of a second size, and one or more blue LED chips of a third size, at least one of the first size, the second size, and the third size being a different size;

electrically connecting, via wirebonding, each of the plurality of LED chips between the first and second electrically conductive traces; and molding at least an outer top surface of an encapsulant over the first surface of the submount and over the plurality of LED chips so that the outer top surface of the encapsulant is substantially flat, wherein the encapsulant comprises at least one lateral exterior wall that extends entirely to one of the outer edges of the submount, wherein the LED component has a full width at half maximum (FWHM) beam angle that is greater than 125°, wherein the one or more red LED chips collectively comprise a first total light-emitting area, wherein the one or more green LED chips collectively comprise a second total light-emitting area, and wherein the one or more blue LED chips collectively comprise a third total light-emitting area, each of the first, second, and third total light-emitting areas being substantially similar total light-emitting areas, and wherein the LED component is devoid of a retention wall laterally surrounding the encapsulant.

16. The method of claim 15, wherein the encapsulant is co-planar with a lateral exterior wall of the submount.

17. The method of claim 15, comprising arranging the plurality of LED chips into a plurality of linear strings of LED chips, wherein each of the plurality of linear strings of LED chips are electrically connected between the first and second electrically conductive traces.

18. The method of claim 15, wherein all lateral exterior walls of the encapsulant extend entirely to a corresponding outer edge of the submount to be co-planar with a corresponding lateral exterior wall of the submount.

19. The method of claim 15, wherein the FWHM beam angle of the LED component is approximately 128° or more.

20. The method of claim 15, wherein the one or more red LED chips comprises a plurality of red LED chips, the one or more green LED chips comprises a plurality of green LED chips, and the one or more blue LED chips comprises a plurality of blue LED chips.

21. The method of claim 15, wherein the plurality of LED chips comprise at least one white LED chip.

* * * * *